United States Patent
Marolia

(10) Patent No.: US 9,679,090 B1
(45) Date of Patent: Jun. 13, 2017

(54) SYSTEMATICALLY EXPLORING PROGRAMS DURING TESTING

(71) Applicant: Amazon Technologies, Inc., Seattle, WA (US)

(72) Inventor: Faizaan Kersi Marolia, Bangalore (IN)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/524,972

(22) Filed: Oct. 27, 2014

(51) Int. Cl.
G06F 9/44 (2006.01)
G06F 17/50 (2006.01)
G06F 3/01 (2006.01)
G06F 11/36 (2006.01)

(52) U.S. Cl.
CPC .......... G06F 17/5009 (2013.01); G06F 3/01 (2013.01); G06F 11/3688 (2013.01); G06F 11/3692 (2013.01)

(58) Field of Classification Search
CPC ............ G06F 11/3672; G06F 11/3688; G06F 3/0488; G06F 11/2294; G06F 2201/86; G06F 17/5009; G06F 17/30572; G06Q 10/10
See application file for complete search history.

(56) References Cited

U.S. PATENT DOCUMENTS

| | | | | |
|---|---|---|---|---|
| 5,600,789 A * | 2/1997 | Parker | ................. | G06F 11/3688 714/38.11 |
| 2003/0131290 A1* | 7/2003 | Weinberg | ............ | G06F 11/3688 714/46 |
| 2006/0199167 A1* | 9/2006 | Yang | ................... | G06F 17/5009 434/365 |
| 2007/0089091 A1* | 4/2007 | Larab | ..................... | G06Q 10/10 717/124 |
| 2007/0261035 A1* | 11/2007 | Duneau | ............... | G06F 11/3688 717/135 |
| 2010/0275163 A1* | 10/2010 | Gillespie | ............... | G06F 3/0488 715/810 |
| 2012/0198279 A1* | 8/2012 | Schroeder | .......... | G06F 11/3672 714/32 |

\* cited by examiner

*Primary Examiner* — Tuan Vu
(74) *Attorney, Agent, or Firm* — Lee & Hayes, PLLC

(57) ABSTRACT

A testing service is used to test the operation of a program. The testing service systematically explores the display screens generated by the program. The testing service also identifies the elements that are displayed on the screen and programmatically interacts with the elements. Test data including performance metrics and screen captures may be recorded during the testing. Test results associated with the testing of the program are provided to an authorized user.

20 Claims, 13 Drawing Sheets

US 9,679,090 B1

SYSTEMATICALLY EXPLORING PROGRAMS DURING TESTING

BACKGROUND

The number of available models of smartphones and tablet computing devices has grown exponentially during the last few years. The various models of smartphones, tablets, and other computing devices frequently have different hardware configurations, even when the devices are configured to execute the same operating system. For example, different smartphone models based upon the ANDROID operating system might include different processors, different amounts of memory, and different peripheral devices, such as cameras, global positioning system ("GPS") sensors, and others. These devices might also include significant variations in software configurations. For example, some models might be configured with different versions of the ANDROID operating system and/or with different software installed on the devices by the manufacturers of the devices. Smartphone and tablet devices executing other operating systems from other manufacturers might also include great variations in hardware and software.

The significant variation in the software and hardware configuration of smartphone, tablet, and other types of computing devices can make it difficult for developers to create programs that execute properly on a wide range of devices. For example, a developer might test the operation of their program on a single device that they own. It is, however, usually cost prohibitive for a developer to purchase many physical devices to use for testing.

It may also be difficult to develop the tests that are to be performed when testing the program. While a developer might utilize a device emulator to test the execution of a program on some available devices, device emulators might also have limitations on the type and depth of testing that can be performed. As a result, a program created by a developer might not execute optimally on devices other than the physical device, or devices, that the developer is able to specifically test the execution of the program upon. A program that does not execute properly can be frustrating to both the developer and to the customers that purchase the program.

The disclosure made herein is presented with respect to these and other considerations.

DETAILED DESCRIPTION

Figure 1:
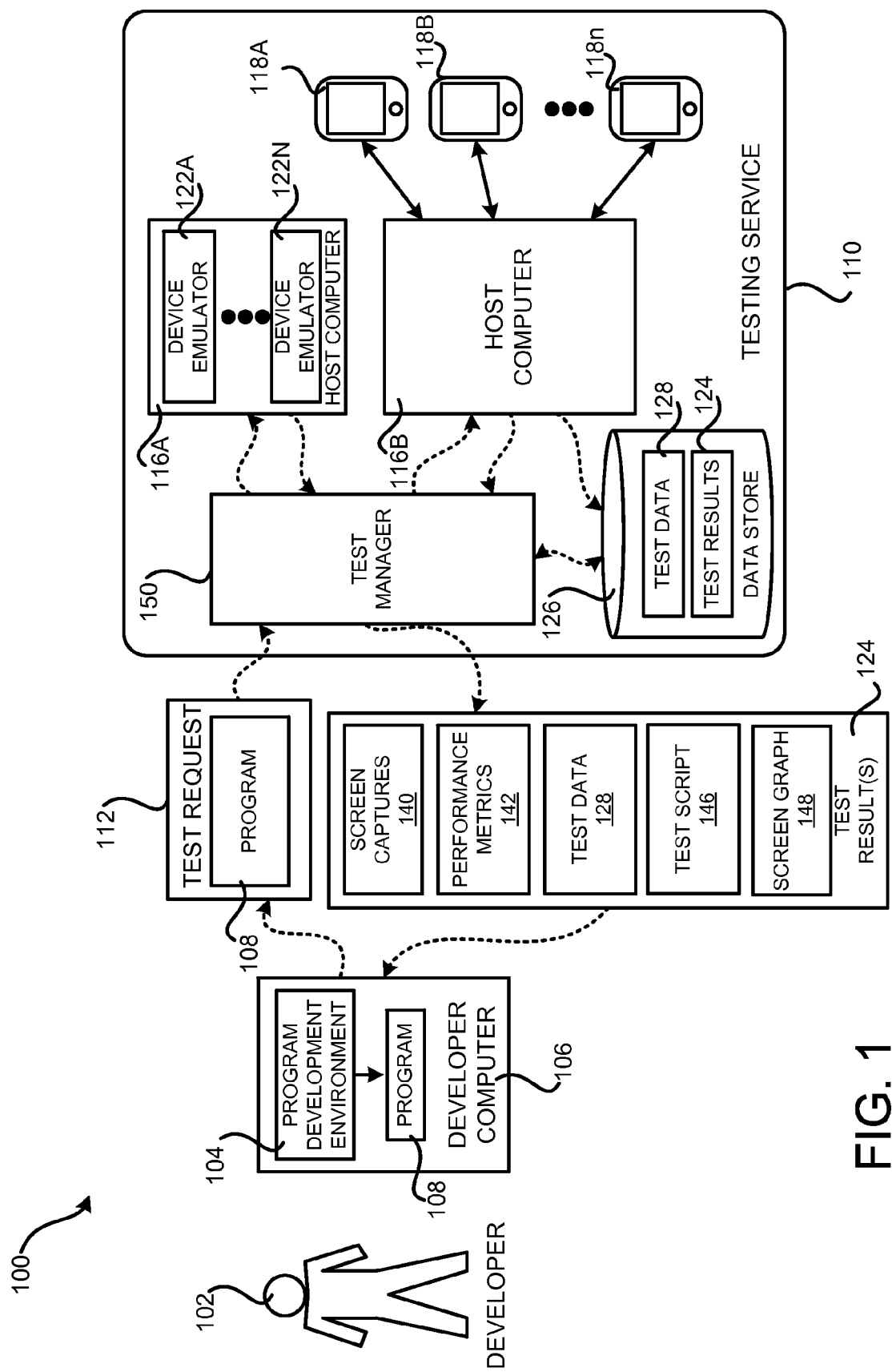
FIG. 1 is a block diagram depicting an illustrative operating environment in which a program may be systematically explored during testing to detect device compatibility issues.

The following detailed description is directed to technologies for systematically exploring programs during testing. Utilizing the technologies described herein, a program testing service may be provided that includes functionality for permitting developers to test the operation of programs on a wide variety of physical computing devices and/or device emulators without having to develop test cases. Through the use of such a program testing service, a developer can quickly, easily and economically test the operation of a program without first having to develop test cases on many physical computing devices, such as smartphones, tablets and, potentially, other types of device. The testing might be used to detect possible device compatibility issues with one or more devices (e.g., a program crash) or determine the amount of resources (e.g., memory) the program uses during operation. Through this type of testing, the developer may improve the likelihood that their program will execute properly on a wide range of computing devices.

The testing service may include host computers that might have some number of smartphones or tablet computing devices or other types of mobile computing devices connected thereto. The connected devices might have different hardware and/or software configurations. Other types of devices might also be connected to the host computers for use in testing programs. In some examples, a developer, or some other authorized user, may select the devices to use to test the execution of a program.

In some configurations, the host computers might utilize device emulators to emulate a physical hardware device. For example, a host computer might be configured to execute some number (e.g. two or three) of device emulators in virtual machine instances. The device emulators might emulate the physical hardware of devices, like smartphones or tablet computers, having different hardware and/or software configurations.

Once the developer has created the program to be tested, the developer may be presented with a list of the available devices and/or device emulators for use in testing the operation of the program. The developer may then be permitted to select one or more devices and/or device emulators for use in testing the operation of the program. Once this selection has been made by the developer or some other authorized user, a test request is submitted to the testing service. The test request might include the program, data identifying the program to test and data identifying the test devices (e.g., physical devices and/or device emulators) that should be used for testing the operation of the program.

When the test request is received, a test manager, workflow coordinator, or some other component or device in the testing service may determine whether the computing devices and/or device emulators that the program is to be tested on are available for use (i.e. not in use testing another program). If the devices and/or device emulators that the program is to be tested on are not available for use, a workflow component may cause the test request to be queued until such time as the devices and/or device emulators required for testing become available for use.

If the devices and/or device emulators are available for use, the workflow coordinator, in conjunction with other components in the service provider network, may cause the program to be installed on the devices and/or device emulators upon which testing is to be performed. The program is then launched and executed on the devices and/or device emulators.

The test manager, or some other component, may systematically explore (e.g., crawl), without user interaction, the program to identify the screen displays generated by the program. In some examples, the systematic exploration begins from one display screen (e.g., the "seed" display screen) and continues to other display screens generated as a result of programmatic interactions with the display of the program. For instance, the test manager may start the testing of the program on the "home" screen of the program, test all or a portion of the elements (e.g., user interface elements) on the home screen, and then move to another screen identified during the testing of the home screen for testing. In some configurations, each of the screen displays that are generated by the program are tested. In other configurations, only a portion of the screen displays are programmatically tested.

According to some examples, one or more of the UI elements that are presented by a program on a screen display are programmatically identified. For example, the elements might be identified by using a graphical analysis mechanism (e.g., identify certain graphical shapes), by programmatically examining program code for the program, by simulating touch actions, or other actions, at various locations on the display screen, or the like.

The elements on a screen display might include different types of elements. For example, the elements might be elements that receive input (e.g., radio buttons, check boxes, text boxes), elements that display content (e.g., images, text) but do not receive input, elements that receive a selection (e.g., a submit button), elements that perform some other action, and the like. According to some examples, all or portion of the elements that are associated with a display screen might be programmatically tested by the test manager.

In some configurations, the interactions that may be programmatically performed might test the ability of a user to interact with various elements provided by the program, send actions such as touch events, text entry, contextual selections, key-presses or button selections to the program, mimic changes in orientation of the computing device, mimic changes in a position or orientation of a user in relation to the computing device programmatically assert on different variables used in the program, verify and/or assert the text displayed in different in UI elements by the program, change device settings (e.g., wireless, power, display), and perform other kinds of tests.

As the testing is being performed, test data may be recorded. For example, a screen capture may be generated that shows a current state of the display of the program that occurs in response to the programmatically performed interaction. Performance metrics may also be recorded during the tests. For example, the performance metrics might include a memory usage, a central processing unit ("CPU") usage, a network traffic usage, a battery usage, a graphics usage, or the like. According to some configurations, the test data may include the screen displays accessed, the elements identified on the screen displays and the programmatic interactions associated with the screen displays. In some examples, this testing data may be used to create a test script that might be provided to the developer. As used herein, the term "test script" may refer to a set of instructions that may be performed when testing the program. For example, the test script may be used by the developer to recreate the testing as performed by the testing service.

Test data may be provided in real-time or provided at some other point. For example, textual data, graphical representations of data, screen captures, or other types of data generated by a device or a device emulator upon which testing is being performed might be included in the test data and provided to the developer.

Once the testing of the program has completed, the results of the testing may be gathered and transmitted to the developer of the program. The test results might include summary results (e.g. whether a particular test passed or failed), detailed results such as log files generated by the program or the test case, screen captures taken prior to, during, and/or after testing, one or more test scripts, a screen graph indicating the screen displays that have been explored during the testing, and, potentially, video captured from the device and/or device emulator during testing. In some examples, the test results may be provided in a GUI. In other examples, the test results may be provided in a document, e-mailed, or the like.

The developer may utilize the test results to modify aspects of the operation of the program. In this way, a developer can utilize the testing service described above to quickly, easily and economically test the operation of a program without having to supply or develop tests for many physical computing devices, such as smartphones or tablets, and/or device emulators for many different computing devices. Additional details regarding the various components and processes described above for providing and utilizing a network-based program testing service will be presented below with regard to FIGS. 1-9.

It should be appreciated that the subject matter presented herein may be implemented as a computer process, a computer-controlled apparatus, a computing system, or an article of manufacture, such as a computer-readable storage medium. While the subject matter described herein is presented in the general context of program modules that execute on one or more computing devices, those skilled in the art will recognize that other implementations may be performed in combination with other types of program modules. Generally, program modules include routines, programs, components, data structures, and other types of structures that perform particular tasks or implement particular abstract data types.

Those skilled in the art will also appreciate that aspects of the subject matter described herein may be practiced on or in conjunction with other computer system configurations beyond those described herein, including multiprocessor systems, microprocessor-based or programmable consumer electronics, minicomputers, mainframe computers, handheld computers, personal digital assistants, e-readers, cellular telephone devices, special-purposed hardware devices, network appliances, and the like. As mentioned briefly above, the technologies described herein may be practiced in distributed computing environments, where tasks may be performed by remote computing devices that are linked through a communications network. In a distributed computing environment, program modules may be located in both local and remote memory storage devices.

In the following detailed description, references are made to the accompanying drawings that form a part hereof, and that show, by way of illustration, specific configurations or examples. The drawings herein are not drawn to scale. Like numerals represent like elements throughout the several figures (which may be referred to herein as a "FIG." or "FIGS.").

FIG. 1 is a block diagram depicting an illustrative operating environment 100 in which a program may be systematically explored during testing to detect device compatibility issues. As shown in FIG. 1, a developer 102 might utilize an appropriate developer computer 106 to execute a program development environment 104. A program development environment 104 may be an environment that allows a user to create, compile, and execute a program, such as the program 108. In some examples, the program development environment 104 may be the ECLIPSE integrated development environment ("IDE") from the ECLIPSE FOUNDATION. It should be appreciated, however, that other IDEs and other types of program development environments 104 from other vendors might also be utilized with the mechanisms disclosed herein.

In some configurations, the program 108 may be an executable or interpreted program configured for executing on a computing device, such as a smartphone, a tablet computing device, an e-reader device, or another type of computing device. In this regard, it should be appreciated that while the examples disclosed herein are primarily presented in the context of smartphone computing devices, the technologies disclosed herein might also be utilized with other types of computing devices. For example, and without limitation, the technologies disclosed herein might be utilized with tablet computing devices, video game devices, set-top box devices, and other types of computing devices. The specific configurations disclosed herein should not be construed as being limited to a smartphone device or a device from a particular manufacturer.

In order to test the operation of the program 108 with a variety of computing devices, the developer 102 might utilize the testing service 110. In some examples, the testing service 110 may be operated or associated with a service provider, and may be configured to provide a network-based service for testing a program, such as the program 108, on a variety of computing devices.

In some examples, the developer 102 does not provide test cases that are used to test the program 108. Instead, the testing service 110, utilizing the test manager 150, may systematically explore (e.g., crawl) the UI screens displayed by the program 108 in response to various interactions with the program 108. In some configurations, the testing of the program 108 is performed without user interaction after the request to test the program is received. Stated another way, in some examples, a user is not required to identify tests and/or analyze the operation of the program 108 during the testing.

During testing of a program 108, the test manager 150 might programmatically interact with the program 108. As discussed above, some of the interactions might be programmatically performed, include, but are not limited to, simulating touch on a display screen, text entry, contextual selections (e.g., radio boxes, check boxes), key-presses or button selections to the program, simulate changes in orientation of the computing device, simulate changes in a position or orientation of a user in relation to the computing device, programmatically assert on different variables used in the program, verify and/or assert the text displayed in different in UI elements by the program 108, change device settings (e.g., wireless, power, display), simulate the presence or removal of external devices (e.g., a speaker, a keyboard) and provide other kinds of tests implementations. In some examples, the test manager 150 sends (e.g., injects) the actions or events to the program 108 such that the program 108 programmatically reacts to the sent action or event. For example, sending a touch event that simulates a user touching a UI element may cause the program 108 to generate a new display screen.

One or more stress tests that send pseudo random events to a device while a program 108 is being tested might also be performed. For example, one or more settings that are associated with a device might be changed (e.g., turn on/off wireless internet, Bluetooth). In some examples, various device settings may be randomly selected during the testing. In other examples, a list of device settings may be programmatically changed during the testing.

As the test is being performed on the program 108, different performance metrics may be recorded. The recorded performance metrics 142 might be automatically (e.g., programmatically) or manually analyzed to determine an impact on parameters, such as, but not limited to battery life, CPU, memory usage, network traffic or other operational aspects. According to some examples, the performance metrics 142 metrics are recorded at specified intervals (e.g., every five seconds, ten seconds) during the testing of the program 108. In other examples, the performance metrics 142 may be recorded at other intervals.

In some configurations, the developer 102 might be permitted to select one or more computing devices 118 within the testing service 110 that are to be utilized for testing the operation of the program 108. For example, a list of available devices 118 might be presented to the developer 102. In other implementations, the particular device 118, or devices 118, upon which a program is to be tested might be selected through an analysis of the program 108. For example, if the program 108 has been created for use with a particular operating system or device type, this information might be utilized to select the device 118, or devices 118, upon which the program 108 is to be tested.

In some examples, the developer 102 might also be permitted to test the operation of the program 108 on device emulators 122 provided by the testing service 110. The device emulator 122 may be a software emulation of a computing device. Utilizing this mechanism, a developer 102 can simultaneously test the operation of a program 108 upon actual physical computing devices 118 and upon device emulators 122.

According to various examples, the developer 102 can select the specific device, or devices that the developer 102 would like to use when testing the program 108. The developer 102 might also be permitted to select the devices by the operating system version that the devices are executing. In other implementations, the developer 102 might also be permitted to select devices for testing based upon the type of hardware, software, or other aspects of the devices. For example, the developer 102 might request that the program 108 be tested on devices having a camera and a particular version of the ANDROID operating system. A developer 102 might be permitted to select devices, and/or device emulators, for use in testing the program 108 based upon one or more of, a device manufacturer, a device type, a device version, device hardware, operating system version, other software version, or other attributes of a device.

Once the developer 102 has generated the program 108, a test request 112 might be transmitted to the testing service 110. In some examples, the test request 112 may include the program 108, or a reference (e.g., name or link) to the program 108. In other examples, the test request 112 might also include data identifying the devices 118 and/or emulators upon which to perform the testing of the program 108.

In response to receiving a test request 112, various components within the testing service 110 may be configured to cause testing to be performed on the program 108 while executing on the specified devices 118 and/or device emulators 122. For instance, in the example shown in FIG. 1, the testing service 110 includes a host computer 116B that has several computing devices 118A-118N attached thereto. In some configurations, the computing devices 118A-118N are various models of smartphones or tablet computing devices executing the ANDROID operating system. The computing devices 118A-118N might be connected to the host computer 116B by way of a suitable wired connection, such as a USB connection. The computing devices 118A-118N might also be connected to the host computer 116B by way of a suitable wireless connection.

In other implementations, the computing devices 118A-118N are smartphone devices that include only hardware that is unique to the device. For example, a device 118 might be a development motherboard that includes only a processor and memory that is unique to a particular model of mobile computing device. Other hardware devices utilized by the mobile computing device that are common across various devices might be emulated by software executing on the host computer 116. In this way, the cost of each of the devices 118A-118N might be reduced. Other types of development boards and or platforms might also be connected to a host computer 116 in the testing service 110 for use in testing in the manner disclosed herein.

In the example shown in FIG. 1, the testing service 110 also includes a host computer 116A that is executing a number of device emulators 122A-122N. The device emulators 122A-122N may be executing on the physical hardware of the host computer 116A, or in other configurations might be executing within virtual machines executing on the host computer 116A. Other mechanisms for executing the device emulators 122A-122N might also be utilized.

In order to test the operation of the program 108, the program 108 may be installed on the computing devices 118A-118N and/or device emulators 122A-122N specified by the developer 102 (which may also be referred to herein as "the test devices"). Once the program 108 has been installed on the test devices, the test manager 150 may test the operation of the program 108 upon the test devices. In some configurations, these tests may be performed simultaneously, thereby allowing a developer 102 to test the operation of a program 108 on multiple computing devices 118 and/or device emulators 122 simultaneously.

According to some examples, one or more of the elements that are on a screen display generated by the program while executing are programmatically identified by the test manager 150. The elements that are on a screen display might be programmatically identified using one or more mechanisms. For example, the elements might be detected based on a programmatic or manual analysis of the program 108. In some configurations, the elements may be identified, without user interaction, using a graphical analysis mechanism (e.g., edge detection) that identifies one or more elements based on the shape of the element as it is displayed. In other configurations, the test manager 150 might randomly simulate interactions with different portions of the display screen to detect elements. For example, the test manager 150 might inject tap events at various locations on a display screen currently generated by the program 108. The test manager 150 might also inject other events, such as but not limited to a sleep event that causes the test device to go into a low-power state, a pan event that simulates a user panning the test device, a tilt event that simulates a user tilting the test device, and the like. The test manager 150 might also lock the display to a portrait mode or a landscape mode such that the display is not allowed to rotate in response to a user interaction, such as a simulated user interaction. Similarly, the test manager 150 might inject a landscape mode event or a portrait mode event that causes the test device to change to a landscape view mode or a portrait view mode.

As discussed above, the on-screen elements may include, but are not limited to images, text, UI elements, icons, and the like. In some examples, the testing performed by the test manager 150 on the program 108 includes programmatically performing user interactions with all or a portion of the elements. For example, the test manager 150 might simulate a user tapping each element on the display screen by sending a touch event to the program that corresponds to a location of each of the elements on the display screen. In other examples, the test manager 150 might simulate a user entering text by sending a text entry event to a text input element identified on the display screen.

In some configurations, the test manager 150 selects the actions to programmatically perform based on the type of computing device 116 or the device emulator 122 utilized to perform the test. According to some configurations, the test manager 150 may check whether the program 108 is using a particular Application Programming Interface ("API) to identify at least a portion of the actions to perform. For example, the test manager 150 may select to simulate an action that changes a viewing location of a user relative to the device in response to determining that the program 108 uses an API that is related to viewing of lenticular images. According to some configurations, the events or tests that may be programmatically performed by the test manager 150 might be any action that may be performed by a user when executing the program 108.

As the testing is being performed, test data 128 may be captured and stored in the data store 126, or some other location. For example, the test data 128 might include one or more screen captures 140 that are captured when the program 108 is executing. The screen captures 140 may show a current visual state of the program 108 that occurs in response to the programmatically performed interaction. For example, the test manager 150 may simulate a tap event that is at the location of a shopping cart icon that causes the shopping cart display screen to be generated.

As discussed above, the test data 128 may include information about the screen displays accessed, the elements identified on the screen displays and the programmatic interactions performed during the testing. In some examples, the testing data 128 may be used to create a test script 146. In some examples, the test script 146 may be created by testing service 110 and provided to the developer with the test results 124. Once received, the developer may use the test script 146 to recreate the testing of the program 108 as performed by the testing service 110.

The testing service 110 might also create a screen graph 148 that identifies each of the screen displays that have been explored during the testing of the program 108. The screen graph 148 might include a graphical display of the screen displays explored during the testing and/or a textual description relating to the explored screen displays. According to some configurations, the screen graph 148 may be used by the testing service 110 during the testing of the program 108 to determine whether the screen display has already been explored and tested. In some examples, the screen graph 148 might also be provided to the developer with the test results 124. The developer might use the screen graph 148 to confirm that the screen displays of the program 108 have been explored and tested.

The test results 124 may be provided in real-time as program testing occurs or provided at some other point in time. For example, textual data, graphical representations of data, the screen captures 140, or other types of data generated by a device 116 or a device emulator 122 upon which testing is being performed might be included in the test results 124 and provided to the developer 102. In some examples, the test results 124 are provided in a GUI. Example GUIs for presenting test results 124 are shown in FIGS. 2A-2E and described below. In other examples, the test results 124 may be provided in a document, e-mailed, or the like.

The test results 124 might summarize the results of the testing and/or provide more detailed information regarding the performance of the testing. For example, the test results 124 can describe the success or failure of the tests, may provide logs and/or other information from the computing devices 118 and/or the device emulator 122 collected during the performance of the tests, and might provide other information. In some examples, the test manager 150 uses the performance metrics 142 and/or other test data 128, to determine a minimum set of requirements needed to operate the program 108. For instance, the test data 128 or the recorded performance metrics might indicate (e.g., based on memory usage or CPU usage) that the program 108 requires a certain amount of memory or a certain type of processor (e.g., at least a 2 GHZ processor).

Once the developer 102 has received the test results 124, the developer 102 might utilize the test results 124 to modify the operation of the program 108. The developer 102 might then utilize the testing service described above repeatedly to continue testing the operation of the program 108. Additional details regarding the operation of the various components on the developer computer 106 and within the testing service 110 will be provided below with regard to FIGS. 2-10.

FIGS. 2A-2E are screen diagrams showing an illustrative GUI 200 that displays user interface elements that may be used to specify settings associated with testing a program 108 and to view test data generated by the testing of the program 108. In some configurations, the GUI 200 might be used by the developer 102 that develops the program 108.

In the example GUI 200 shown in FIGS. 2A-2E, the GUI 200 presents a test interface that includes UI elements 210A-210J, a test events 220 section, a performance analytics 230 section, a log 240 section, and a screen capture 250 section that includes a display area 252 for presenting the screen captures 140. The GUI 200 might be generated by the test manager 150 as shown in FIG. 1, or some other computing device or component, and presented on a computing device, such as the developer computer 106 by an application. For example, the application might be a web browser program, such as the web browser program 304 illustrated in FIG. 3. The GUI 200 is illustrated for explanation purposes, and is not intended to be limiting. For example, the GUI 200 might include more or fewer UI elements than illustrated in FIGS. 2A-2E. The UI elements might also be arranged in a different manner than shown in FIGS. 2A-2E.

The program name UI element 210A is configured to display the name of the program 108 that was tested or is currently being tested. In the current example, the name of the program 108 is "Store." The test device UI element 210B displays the type of test device on which the testing is performed. In the current example, the test device is the "smartphone-1" test device. In some configurations, the type of test device UI element 210B indicates the specific type and model number of a test device. The UI element 210C is configured to display whether the program 108 crashed or not during the test. In the current example, the "Store" program 108 has not crashed.

The test time UI element 210D is configured to display the amount of time that was spent testing the program 108. In the current example, the test time was three minutes and forty-five seconds. The end test UI element 210E is configured to receive a selection by a user, such as the developer 102, to end the current test. The next device UI element 210E is configured to receive a selection by the user to select another device or the next device in the selected devices 116 or device emulators 122 to perform the test. The select performance metrics UI element 210G is configured to receive a selection by a user to change the performance metrics 142 measured during the testing of the program 108 and/or displayed in the performance analytics section 230. The select test devices UI element 210H is configured to receive a selection of one or more devices 116 or device emulators 122 that are to perform testing on the program 108. The previous screenshot UI element 210I and the next screenshot UI element 210J are configured to receive a selection to navigate the screen captures 140 displayed in the display area 252.

In some configurations, the performance analytics section 230 shows a graphical display of different performance metrics 142 that are selected for display in the GUI 200. In the current example, the user, such as the developer 102, has requested to display performance metrics 142 relating to CPU performance (as indicated by the solid line in the performance analytics 230), memory performance as indicated by the line that follows a dash-dash pattern) and network traffic as indicated by the line that follows a dash-dot-dash pattern. As discussed above, the user, such as the developer 102, might select other performance metrics 142 to display or collect during the testing. FIGS. 2B-2E illustrate a selection of different performance metrics 142.

The test events 220 section illustrates the different events being tested and a time indicating when the event was performed. In the current example, the test events 220 illustrates that simulated input was provided to the "option 1" element eighteen seconds into the test. The selection of the "option 1" element may be seen in the display area 252 by graphical indicator 260. In some examples, the graphical indicator 260 is included in the screen capture 140 such that the user may readily see what action was performed during the testing.

The log 240 may show information that is logged during the testing of the program 108. In some configurations, the user may specify the data that is logged. According to some examples, the user might save the log data, the test event data, or the other data displayed by the GUI 200.

In the current example, the screen capture 250 section includes a display area 252 for presenting the screen captures 140 that are associated with the different events illustrated in the test events 220 section. As illustrated, the display area 252 shows a page generated by the "store" application program 108 during testing on the "smartphone-1" test device. The display area 252 illustrated in FIG. 2A includes a variety of different elements, such as view elements, an input text box, a picture, a menu, a banner, and icons. View elements may refer to any type of visual output generated by the program 108 (e.g., user interface elements, pictures or menus). In the current example, the test manager 150 programmatically selected the "option 1" element as indicated by the graphical indicator 260. According to some configurations, an indicator 212 is illustrated in the performance analytics section 230 that shows the performance metrics 142 at the point in time of the screen capture 140 that is displayed in the display area 252. As the different screen captures 140 are selected for display, a position of the graphical indicator 212 is updated within the performance analytics section 230.

Figure 2A:
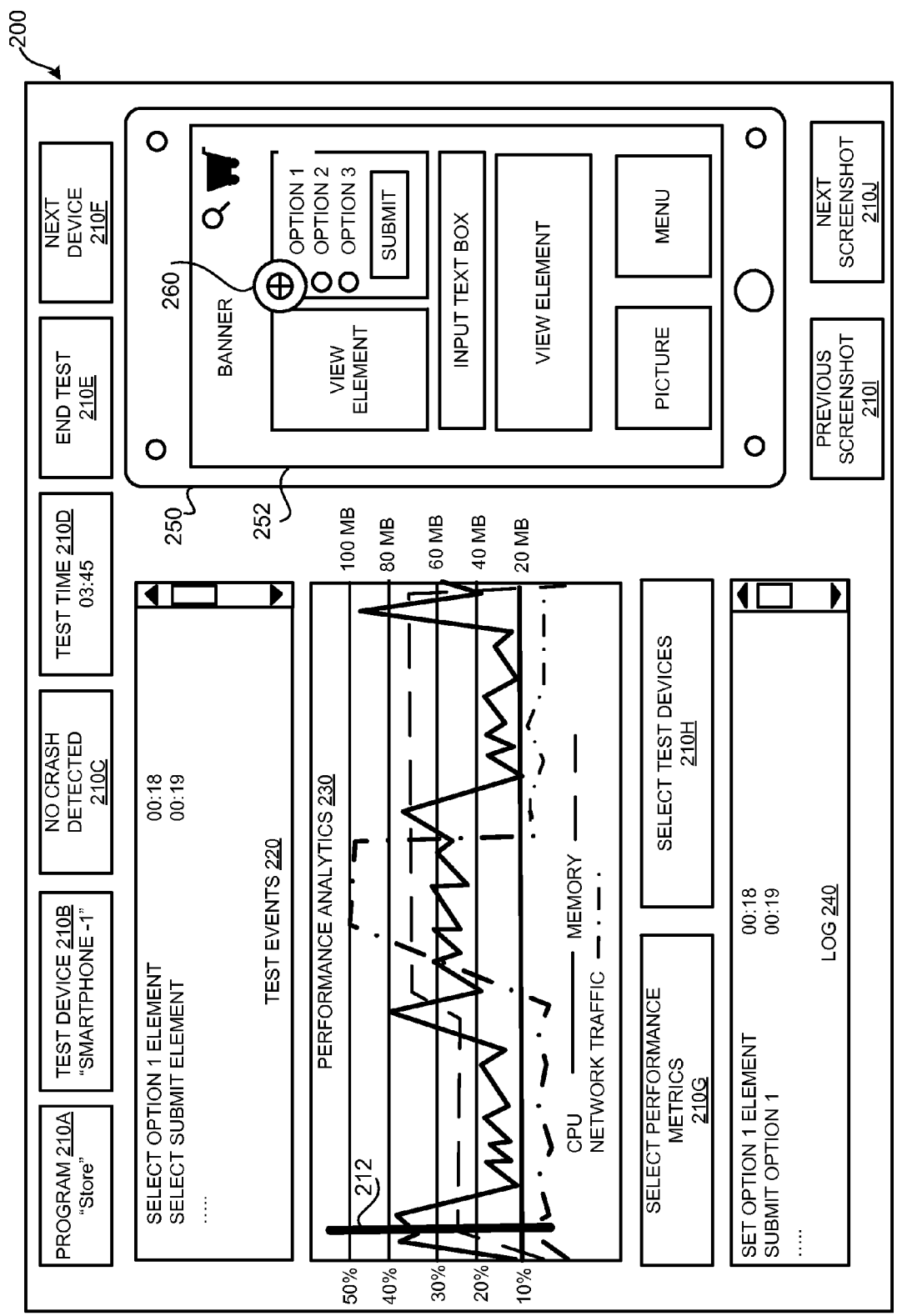
FIGS. 2A-2E are screen diagrams showing an illustrative graphical user interface ("GUI") that displays user interface ("UI") elements that may be used to view test data and specify settings associated with testing a program.
Figure 2B:
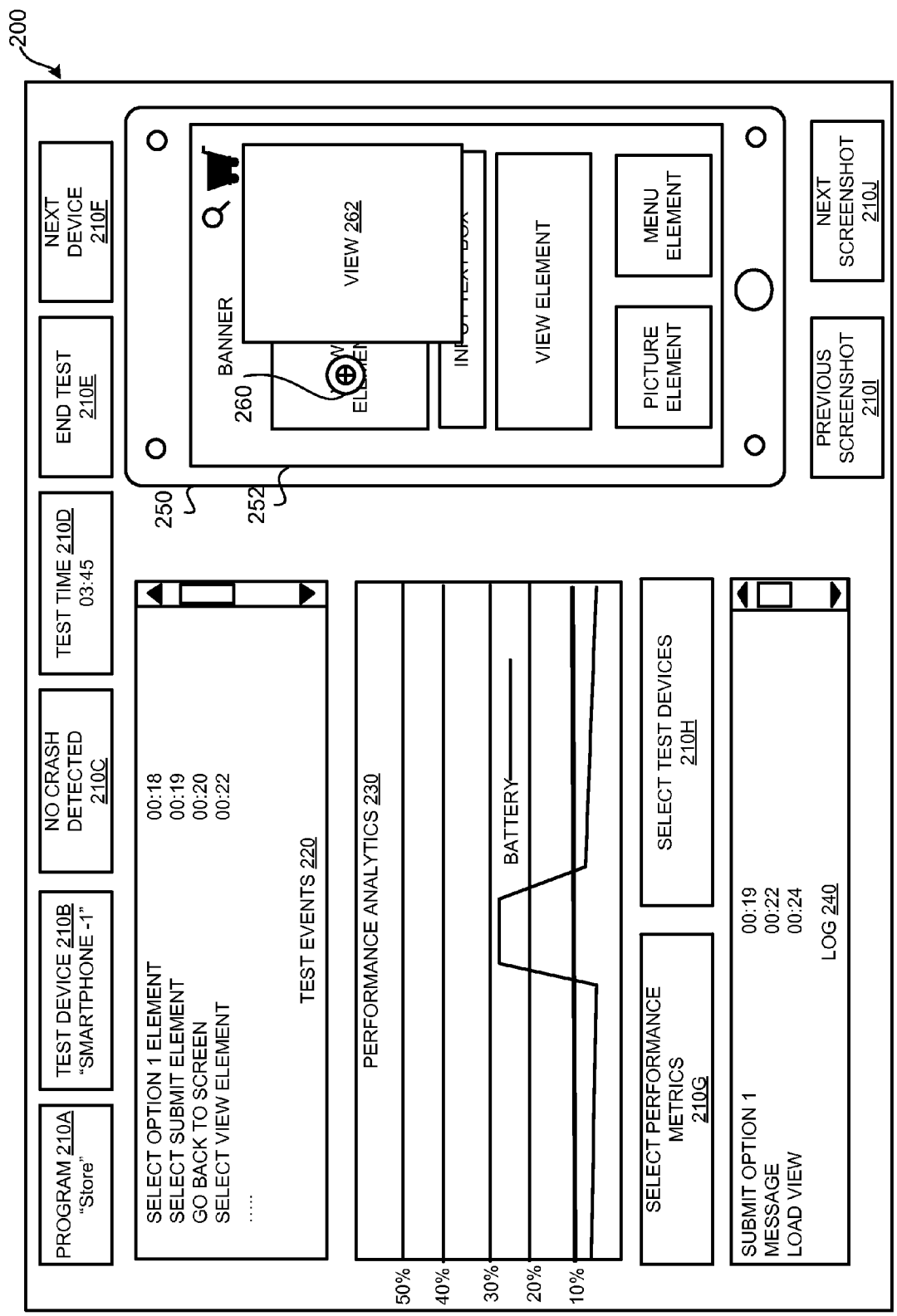

FIG. 2B shows a view of the GUI 200 after the user, such as the developer 102, has selected the next screenshot UI element 210J to advance to the next screen capture 140. As can be seen, the display area 252 shows that the test manager 150 programmatically selected the view element that caused the program 108 to generate the view element 262. FIG. 2B also illustrates that the user selected to display a battery performance metric 142 in the performance analytics section 230 in place of the performance metrics 142 illustrated in FIG. 2A.

Figure 2C:
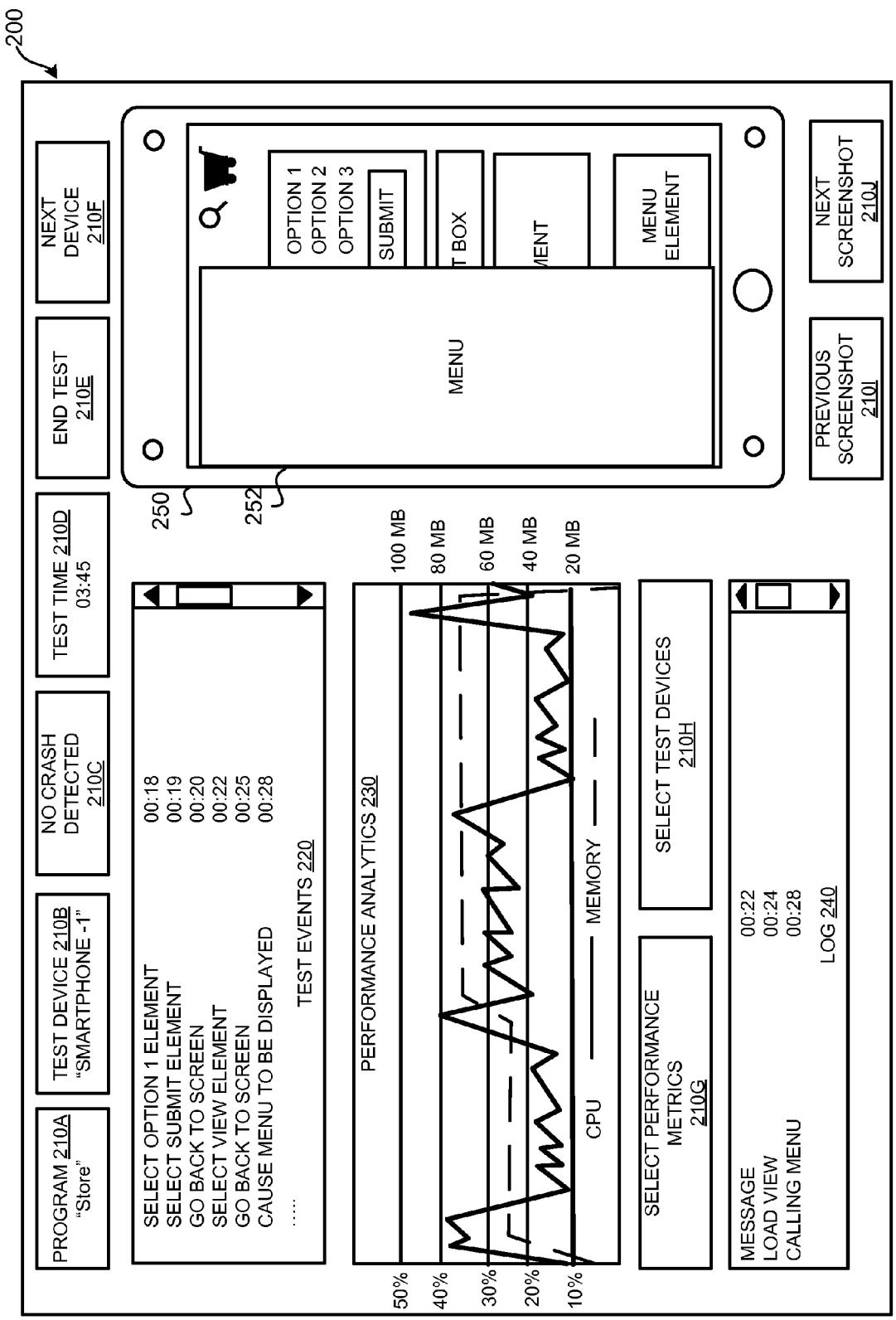

FIG. 2C shows a view of the GUI 200 after the user, such as the developer 102, has selected another screen capture 140 to display. As can be seen, the display area 252 shows that the test manager 150 programmatically caused the menu to be displayed. FIG. 2C also illustrates that the user requested to view the CPU performance metric 142 and the memory performance metric 142 in the performance analytics section 230 in place of the battery performance metric 142 illustrated in FIG. 2B.

Figure 2D:
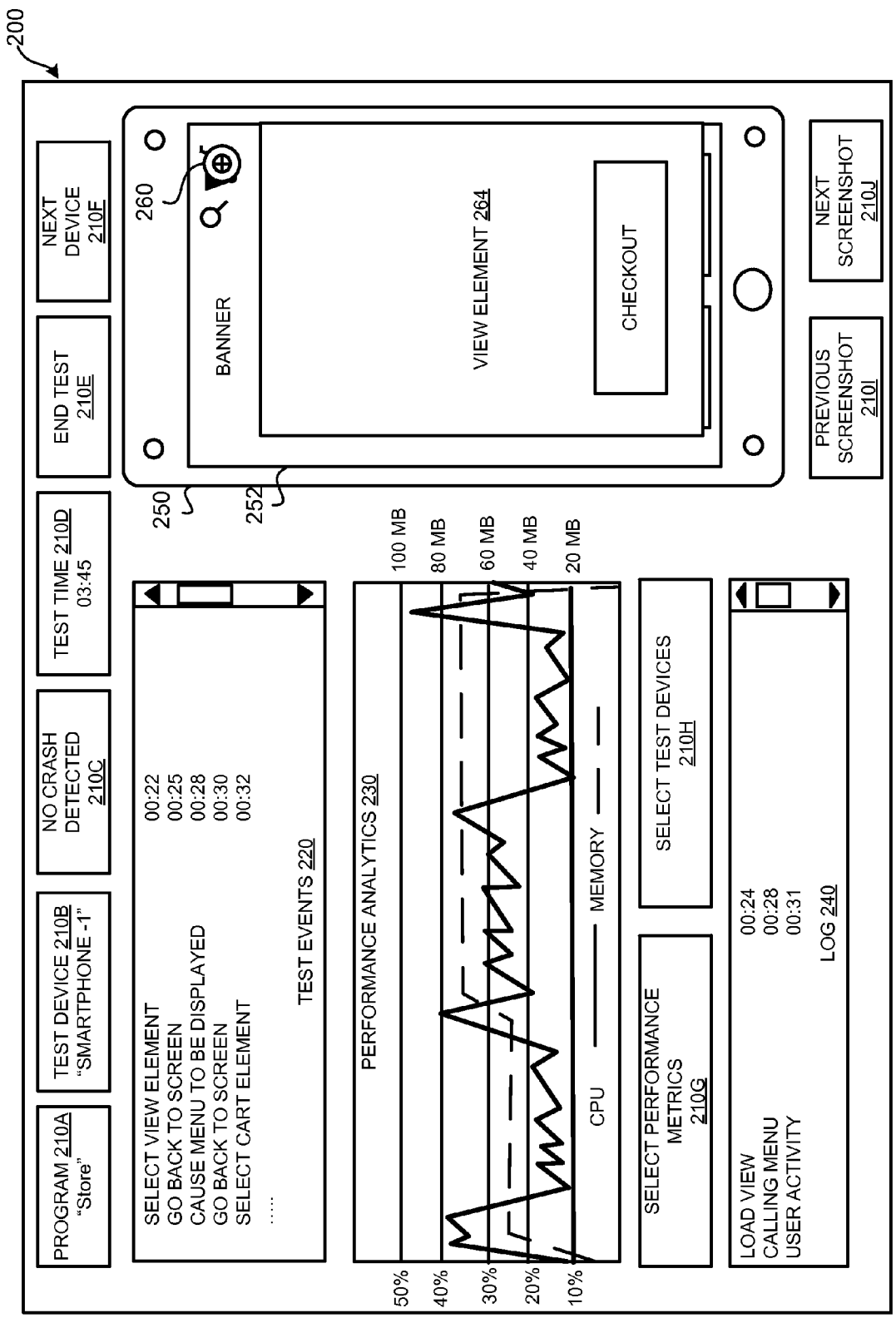

FIG. 2D shows a view of the GUI 200 after the user, such as the developer 102, has selected another screen capture 140 to display. As can be seen, the display area 252 shows that the test manager 150 programmatically selected the cart icon that caused the view element 264 to be displayed.

Figure 2E:
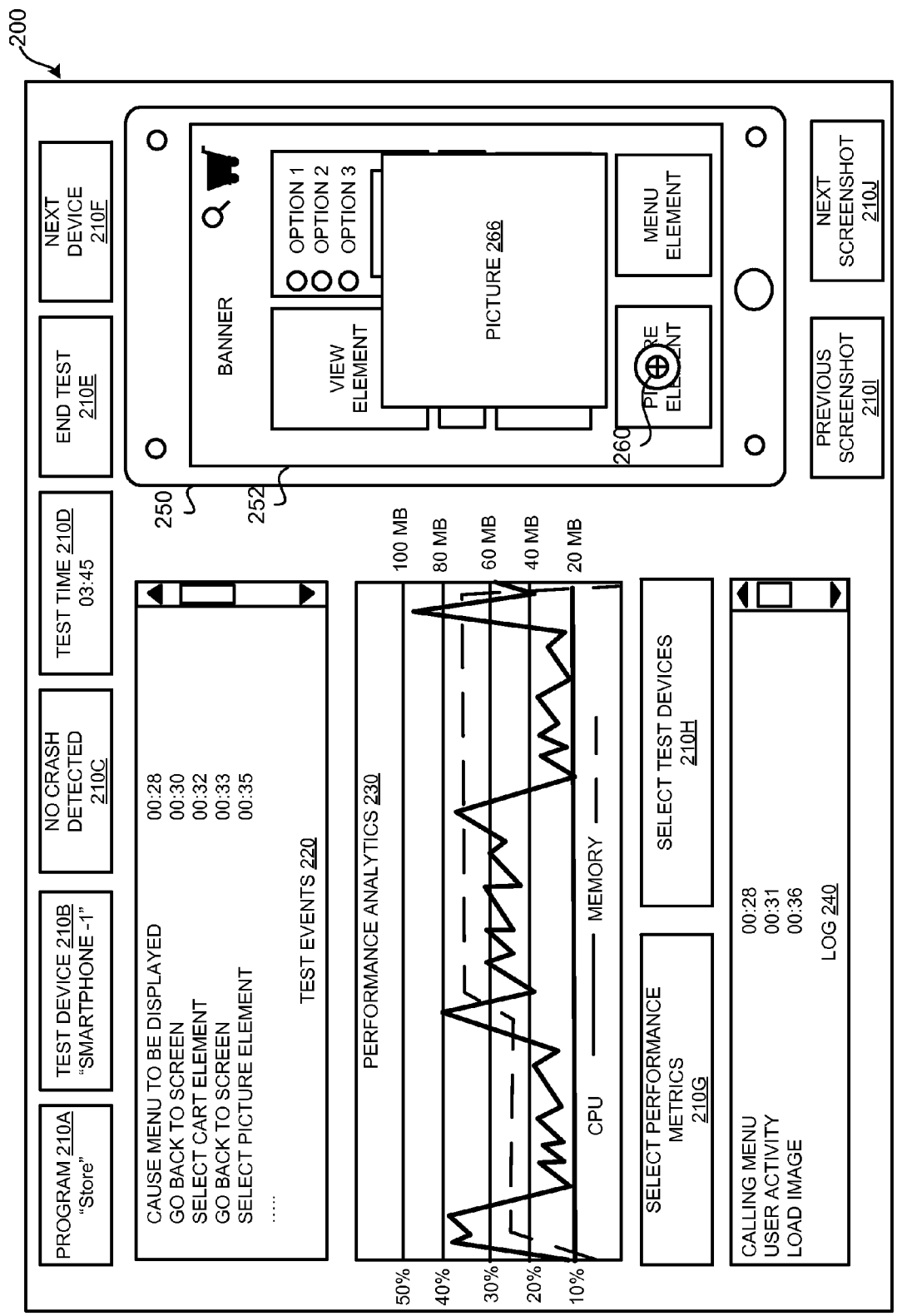

FIG. 2E shows a view of the GUI 200 after the user, such as the developer 102, has selected the picture element to display. As can be seen, the display area 252 shows that the test manager 150 programmatically selected the picture element that caused the picture 266 to be displayed.

Figure 3:
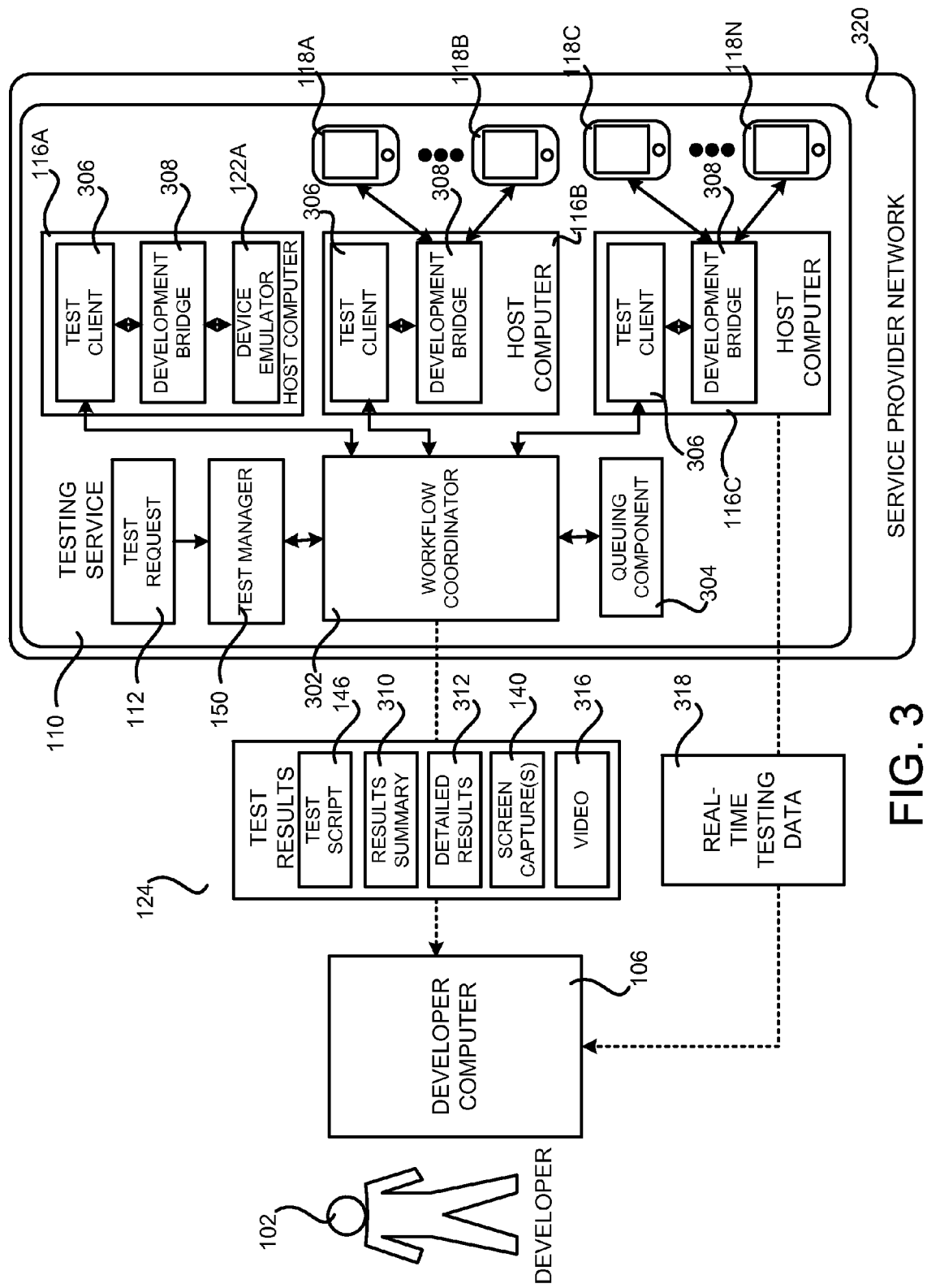
FIG. 3 is a block diagram depicting an illustrative operating environment for testing the operation of a program and providing test results to a requestor.

FIG. 3 is a block diagram depicting an illustrative operating environment for testing the operation of a program and providing test results to a requestor. As shown in FIG. 3 and described briefly above, the testing service 110 may provide a network-based service for testing the operation of a program 108. For example, the testing service 110 may be associated with a service provider network 320. As mentioned above, the program 108 might be submitted to the testing service 110 in a test request 112, or in another manner. One illustrative operating environment for testing the operation of a program is described in U.S. patent application Ser. No. 13/875,955, which was filed on May 2, 2013, and entitled "Program Testing Service," is expressly incorporated herein by reference in its entirety.

In some examples, a workflow coordinator 302 within the testing service 110 receives the test request 112. As will be described in greater detail herein, the workflow coordinator 302 is a component that is configured to assign test requests 112 to host computers 116A-116C within the testing service 110. The workflow coordinator 302 might also receive test results 124 from the various host computers 116A-116C and provide the test results 124 to the developer computer 106 that submitted the test request 112, or to some other computing device.

In some examples, the workflow coordinator 302 may be configured to determine whether the test devices, such as the computing devices 118A-118N and/or the device emulators 122A0-122N, that may be requested in the test request 112 are available for use in testing the program 108. In other examples, the workflow coordinator 302 may be configured to determine whether the test devices that may be requested by the test manager 150 are available for use in testing the program 108. When the requested computing devices 118A-118N and/or the device emulators 122A-122N are not available, the workflow coordinator 302 might utilize a queuing component 304 to queue the test request 112 the requested computing devices 118A-118N and/or device emulators 122A-122N become available.

In some implementations, the test of a program 108 identified by a test request 112 may be queued if one or more of the test devices are unavailable. In other examples, only those test requests 112 that request tests to be performed on unavailable test devices might be queued. Other mechanisms might also be utilized for queuing test requests 112 in other implementations.

If the test devices upon which a test of a program 108 is to be performed are available, the workflow coordinator 302 may transmit the test request 112 to test clients 306 executing on the host computers 116A-116C. For example, if a test request 112 indicates that the program 108 is to be tested while executing on a computing device 118A, the workflow coordinator 302 may transmit the test request 112 to the test client 306 executing on the host computer 116B. In a similar fashion, if a test request 112 indicates that a test is to be performed using a device emulator 122A, the workflow coordinator 302 may transmit the test request 112 to the test client 306 executing on the host computer 116A.

The test client 306 executing on each of the host computers 116A-116C may be configured to receive test requests 112 from the workflow coordinator 302. According to some examples, the test clients 306 are configured to systematically explore the display screens generated by the program, as discussed herein. In response to receiving a test request 112, the test client 306 may cause a development bridge 308 to install the program 108 on the computing device 118 or the device emulator 122 to be tested. According to some configurations, the development bridge 308 provides a mechanism for interacting with a connected computing device 118 or device emulator 122.

In some configurations, the development bridge 308 is the ANDROID Debug Bridge. The ANDROID Debug Bridge may be utilized when the computing devices 118A-118N and/or the device emulators 122A-122N utilize the ANDROID operating system. Other types of bridges might also be utilized when computing devices 118A-118N and/or device emulators 122A-122N configured with other operating systems from other manufacturers are utilized to test the operation of a program 108.

Once the program 108 to be tested has been installed on the computing devices 118A-118N and/or device emulators 122A-122N upon which testing should occur, the operation of the program 108 may be tested using the test manager 150. As described above, the program 108 may be tested by the test manager 150, the test client 306, or some other component, to systematically explore the display screens generated by the program 108. As discussed above, the testing is configured to test various aspects the operation of a program 108 on the target computing devices 118A-118N and/or device emulators 122A-122N.

According to some examples, the host computers 116A-116C may be configured to transmit real-time testing data 318 to the developer computer 106, or some other computing device, while the testing of the program 108 is being performed. For example, in some implementations, the real-time testing data 318 includes text data describing the on-going testing of a program 108 (e.g., the current event being performed) on a particular computing device 118A-118N or device emulator 122A-122N. In other implementations, the real-time testing data 318 may include one or more screen captures 140, or a video display output generated by one of the computing devices 118A-118N and/or device emulators 122A-122N utilized for testing.

The real time testing data 318 might then be presented on the developer computer 106 for viewing by the developer 102. In this manner, the developer 102 can view the real time operational testing of the program 108 on a computing device 118A-118N or device emulator 122A-122N. When multiple tests are being performed simultaneously, a mechanism might be utilized at the developer computer 106 that allows the developer 102 to select a computing device 118A-118N and/or device emulator 122A-122N for which the real-time testing data 318 is displayed.

Once the testing of the program 108 has completed on the computing devices 118A-118N and/or the device emulators 122A-122N, each of the host computers 116A-116C provides test results 124 to the workflow coordinator 302. In turn, the workflow coordinator 302 provides the test results 124 to the developer computer 106. As shown in FIG. 3, the test results 124 might include a results summary 310, which indicates whether the tests passed or failed. The test results 124 might also include detailed results 312 that include detailed information regarding the performance of the tests on the computing devices 118A-118N and/or device emulators 122A-122N. For example, the detailed results 312 might include log files and/or other detailed results generated by the computing device 118, emulator 122, and/or development bridge 308 during the testing of the program 108 on the computing devices 118A-118N and/or the device emulators 122A-122N.

In some implementations, the test results 124 also include screen captures 140 taken on the computing devices 118 and/or the device emulators 122 during the testing of the program 108. Similarly, the test results 124 might also include video 316 captured from the computing devices 118 and/or the device emulators 122 during all or a portion of the testing of the program 108. The test results 124 might also include the test script 146 and/or the screen graph 148. In this regard, it should be appreciated that the content of the test results 124 illustrated in FIG. 3 are merely illustrative and that other types of information might be provided in the test results 124.

Appropriate functionality might also be provided at the developer computer 106 for presenting the test results 124 to the developer 102. Utilizing the test results 124, the developer 102 can make changes to the program 108 utilizing the program development environment 104. The developer 102 might then resubmit the program 108 to the testing service 110 for continued testing in the manner described above.

Figure 4:
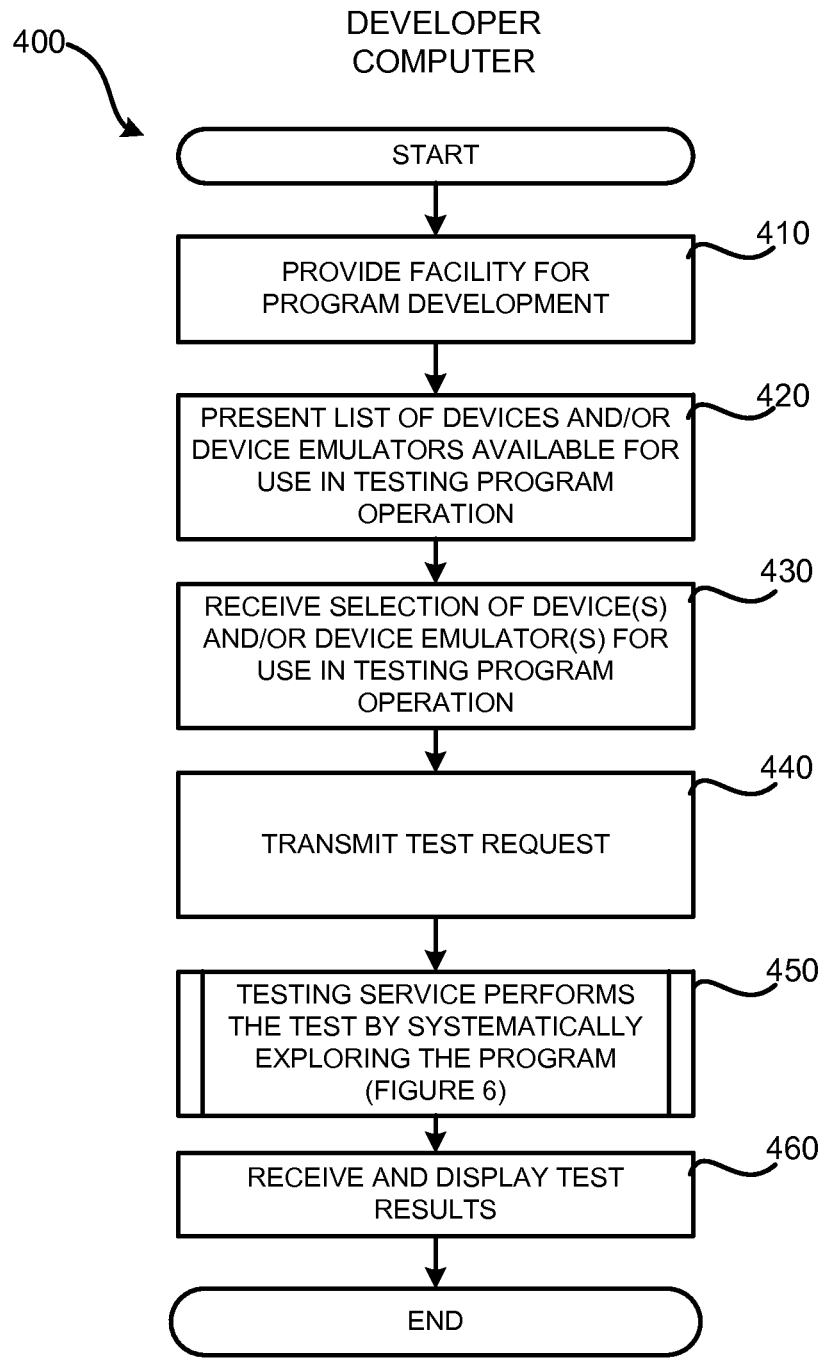
FIG. 4 is a flow diagram showing a routine illustrating aspects of a mechanism disclosed herein for the operation of a developer computer for requesting that a program test service test a program, and for receiving and presenting the results of the testing of the program.

FIG. 4 is a flow diagram showing a routine 400 illustrating aspects of a mechanism disclosed herein for of the operation of a developer computer 106 for requesting that a program testing service 110 test a program 108, and for receiving and presenting the results 124 of the testing of the program. It should be appreciated that the logical operations described herein with respect to FIG. 4, and the other FIGS. may be implemented (1) as a sequence of computer implemented acts or program modules running on a computing system and/or (2) as interconnected machine logic circuits or circuit modules within the computing system.

The implementation of the various components described herein is a matter of choice dependent on the performance and other requirements of the computing system. Accordingly, the logical operations described herein are referred to variously as operations, structural devices, acts, or modules. These operations, structural devices, acts, and modules may be implemented in software, in firmware, in special purpose digital logic, and any combination thereof. It should also be appreciated that more or fewer operations may be performed than shown in the FIGS. and described herein. These operations may also be performed in parallel, or in a different order than those described herein.

The routine 400 may begin at operation 410, where a facility may be provided on the developer computer 106 for developing the program 108. As described above, a program development environment 104 might be utilized in various examples to develop the program 108.

From operation 410, the routine 400 may flow to operation 420, where a list of the computing devices 118A-118N and/or device emulators 122A-122N that are available through the testing service 110 for use in testing the operation of the program 108 may be presented. As mentioned above, such a list may be presented through a plug-in 301 provided in the program development environment 104 or through a Web portal 306 provided by the testing service 110. Other mechanisms might also be utilized to provide a list of the available computing devices 118A-118N and the device emulators 122A-122N for testing operation of the program 108. In other examples, the test devices may be selected by another authorized user and/or be predefined.

From operation 420, the routine 400 may proceed to operation 430 where a selection of computing devices 118A-118N and/or device emulators 122A-122N for use in testing the operation of the program 108 may be received from the developer 102, or some other authorized user. In response thereto, the routine 400 may proceed to operation 440.

At operation 440, a test request 112 may be transmitted to the testing service 110. As discussed above, the test request 112 might include the program 108, or a reference to the program 108, and data identifying the computing devices 118A-118N and/or device emulators 122A-122N upon which testing should occur.

From operation 440, the routine 400 may proceed to operation 450 where the test is performed. As discussed above, the test manager 150 may systematically explore (e.g., crawl the different screen displays) and programmatically identify the elements on one or more display screens and perform interactions with the program 108 and the different elements. Additional details regarding this process are provided below with regard to FIG. 6.

From operation 450, the routine 400 may proceed to operation 460, where test results may be received and presented. As discussed above, the test results 124 might be provided to the developer computer 106 and might include a results summary 310, detailed results 312, screen captures 140, and/or video 316 in various examples. An appropriate component executing on the developer computer 106, such as the plug-in 301 or the Web browser program 304 or the GUI 200 may be utilized to present the test results 124 to the developer 102. From operation 460, the routine 400 proceeds to and end operation.

Figure 5:
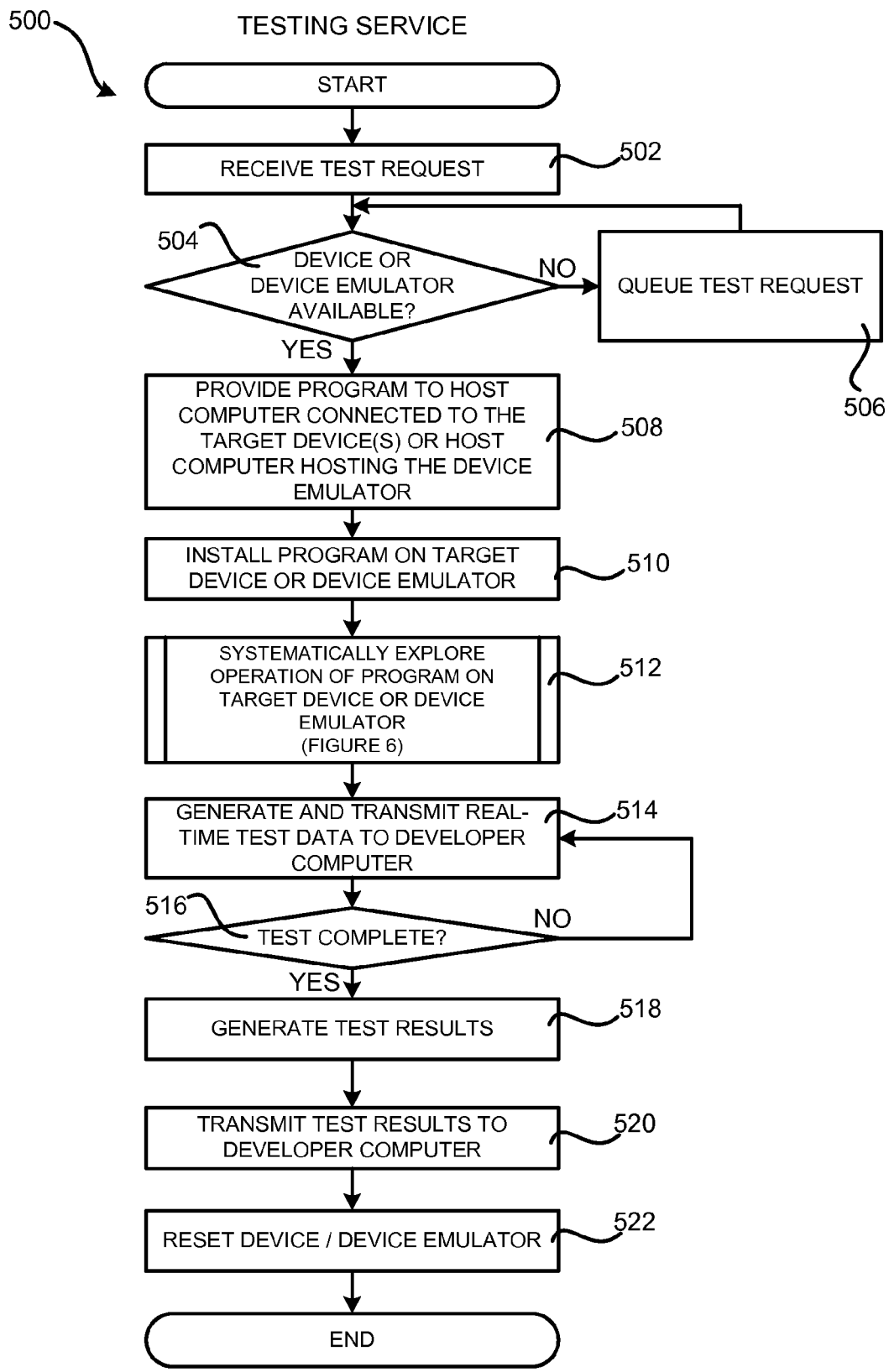
FIG. 5 is a flow diagram showing a routine illustrating aspects of the operation of a testing service configured to systematically test the operation of a program.

FIG. 5 is a flow diagram showing a routine 500 illustrating aspects of a mechanism disclosed herein for the operation of components in a service provider network 320 for testing the operation of a program 108 and for providing results 124 of the testing. The routine 500 may begin at operation 502, where the testing service 110 receives a test request 112. In response to receiving a test request 112, the workflow coordinator 302, the test manager 150, or another component within the testing service 110, may determine, at operation 504, whether the computing devices 118A-118N and/or device emulators 122A-122N are selected for testing are available. As discussed above, in some examples, the computing devices are selected by the developer 102.

If the requested computing devices 118 and/or device emulators 122 are not available, the routine 500 may proceed to operation 506, where the test request 112 may be queued. As discussed above, a queuing component 304 may be provided in the testing service 110 for queuing test requests 112 until the requested computing devices 118A-118N and/or device emulators 122A-122N become available.

When, at operation 504, the workflow coordinator 302 determines that the requested computing devices 118A-118N and/or device emulators 122A-122N are available, the routine 500 proceeds from operation 504 to operation 508. At operation 508, the workflow coordinator 302 provides the test request 112, that may include the program 108, to host computers 116A-116C hosting the computing devices 118A-118N and/or device emulators 122A-122N upon which testing should occur.

The routine 500 may then proceed to operation 510, where the development bridge 308 on the respective host computer 116 installs the program 108 on the identified test devices (e.g., the computing device 118 and/or the device emulators 122) upon which testing is to occur.

Once the program 108 has been installed, the routine 500 may proceed to operation 512 where the program 108 is systematically explored. As discussed above with regard to FIG. 6, the program 108 may be tested and systematically explored on the computing devices 118A-118N and/or device emulators 122A-122N. In some examples, real-time testing data 318 might be transmitted, at operation 514, to the developer computer 106 during the testing of the program 108.

From operation 514, the routine 500 may proceed to operation 516, where a determination is made as to whether the testing of the program 108 has been completed. If testing has not been completed, the routine 500 may proceed back to operation 514, where the testing service 110 may continue to transmit real-time testing data 318 to the developer computer 106 in the manner described above. If, however, testing of the program 108 has been completed, the routine 500 may flow to operation 518.

At operation 518, the test results 124 may be generated. As discussed above, the testing service 110 may generate the test results 124. In some examples, the test results 124 might include the results summary 310, detailed results 312, screen captures 140, test scripts 146, screen graphs 148, and/or video 316 in various examples. The test results 124 might also include other data not specifically mentioned herein.

From operation 518, the routine 500 may proceed to operation 520, where the test results 124 are transmitted to the developer computer 106 for presentation to the developer 102, or use in another manner. As illustrated by operation 522, once the test results 124 have been transmitted to the developer computer 106, a component within the testing service 110, such as the development bridge 308 may be is utilized to reset the computing devices 118A-118N and/or device emulators 122 upon which testing occurred. In this way the computing devices 118 and/or device emulators 122 can be placed into a baseline state for future testing. From operation 522, the routine 500 may proceed to an end operation.

Figure 6:
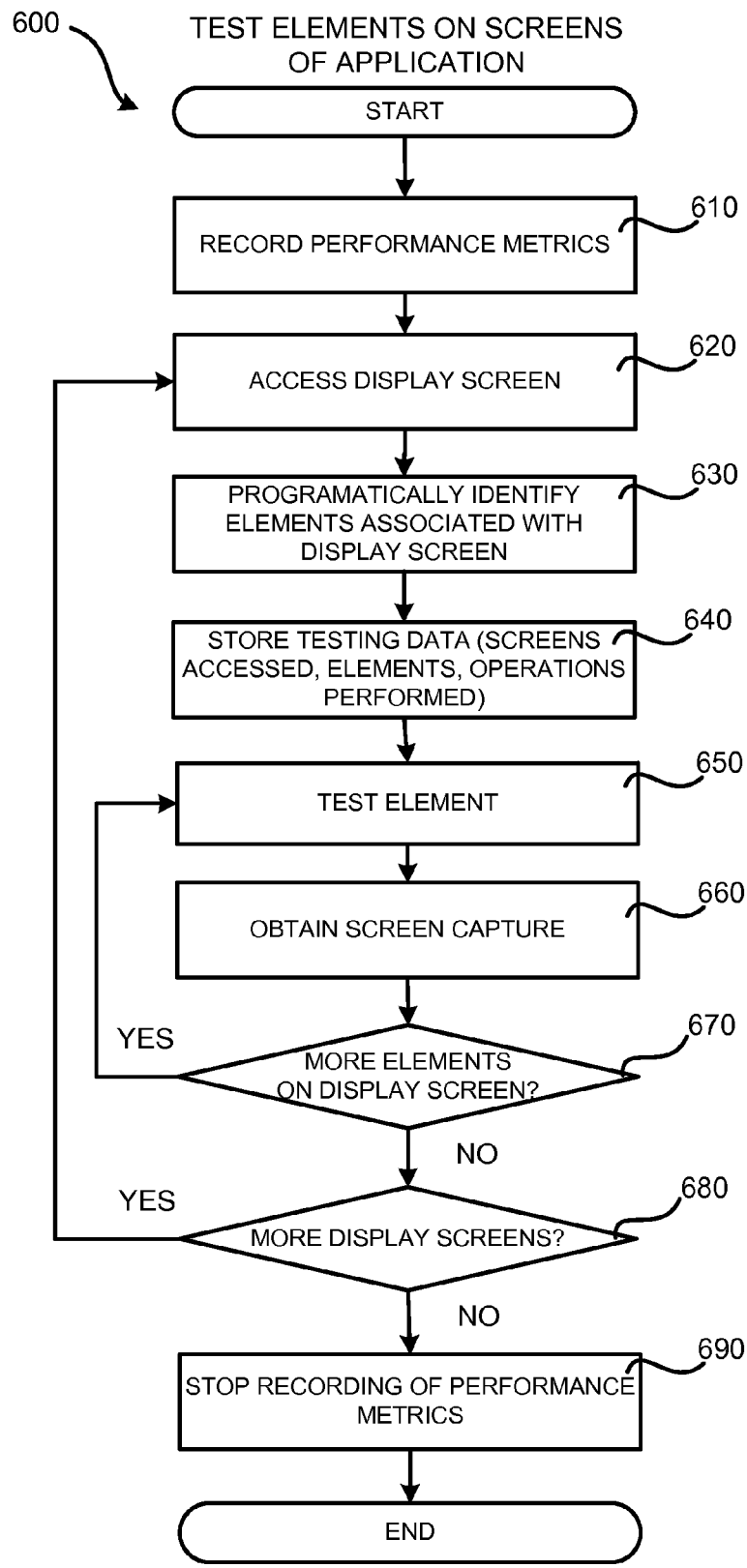
FIG. 6 is a flow diagram showing a routine illustrating aspects of a mechanism disclosed herein for the operation of components in a service provider network for testing the operation of a program and for providing results of the testing.

FIG. 6 is a flow diagram showing a routine 600 illustrating aspects of one mechanism disclosed herein for systematically exploring a program 108 in a testing service 110 for testing the operation of a program 108. The routine 600 may begin at operation 610, where one or more performance metrics 142 may be recorded during the testing of the program 108. As described above, the performance metrics 142 might include a memory usage, a CPU usage, a network traffic usage, a battery usage, a graphics usage, or the like.

From operation 610, the routine 600 may flow to operation 620, where a display screen may be accessed. The display screen may be displayed by the program 108 on the test device and provided to the test manager 150. In some examples, the test manager 150 may analyze a screen capture 140 of the current display screen to programmatically identify the elements that are displayed.

From operation 620, the routine 600 may proceed to operation 630 where the elements on the display screen 140 displayed by the program 108 during testing are programmatically identified. As discussed above, the elements might be identified using a graphical analysis mechanism, by programmatically examining program code for the program 108, by simulating the performance of touch actions, or other actions, at various locations on the display screen, or the like.

From operation 630, the routine 600 may proceed to operation 640 where the test data 128 may be stored. As discussed above, the test data 128 may include information about the screen displays accessed, the elements identified on the screen displays and the programmatic interactions performed during the testing.

From operation 640, the routine 600 may proceed to operation 650 where one or more of the elements identified at operation 630 are tested. As discussed above, the testing of the elements may be programmatically performed. For example, actions may be simulated on a device or device emulator by the testing manager 150 that represent one or more user interactions, or other types of interactions (e.g., from the operating system or another program) with the program 108. As also discussed above, the testing might include changing one or more device settings of a testing device.

From operation 650, the routine 600 may proceed to operation 660 where one or more screen captures 140 are generated. As discussed above, a screen capture 140 might be generated and stored each time the testing manager 150 performs an interaction (e.g., a touch event or some other event) with the program 108.

From operation 660, the routine 600 may proceed to decision operation 670 where a determination is made as to whether there are more elements on the current display screen to test. In response to determining that there are more elements on the current display screen to test, the process may return to operation 650 to test another element. In response to determining that there are not more elements on the display screen to test, the process may flow to decision operation 680.

At decision operation 680, a determination is made as to whether there are more display screens to test. As discussed above, the test manager 150 may test all or a portion of the display screens that are generated by the program 108 during the testing. In response to determining that there are more display screens to test, the process may return to operation 620 to access another display screen. In response to determining that there are no more display screens to test, the process may flow to operation 690 where the recording of the performance metrics may be stopped and process 600 may then flow to an end operation where the testing of the program 108 ends. In other examples, the screens displayed by the program may be identified in a different order. For example, each display screen that is accessed may be followed until there are no further display screens. The routine could then go back to crawl other screens displayed in response to a selection of one or more of the elements. Generally, the screens might be identified using any traversal mechanism.

Figure 7:
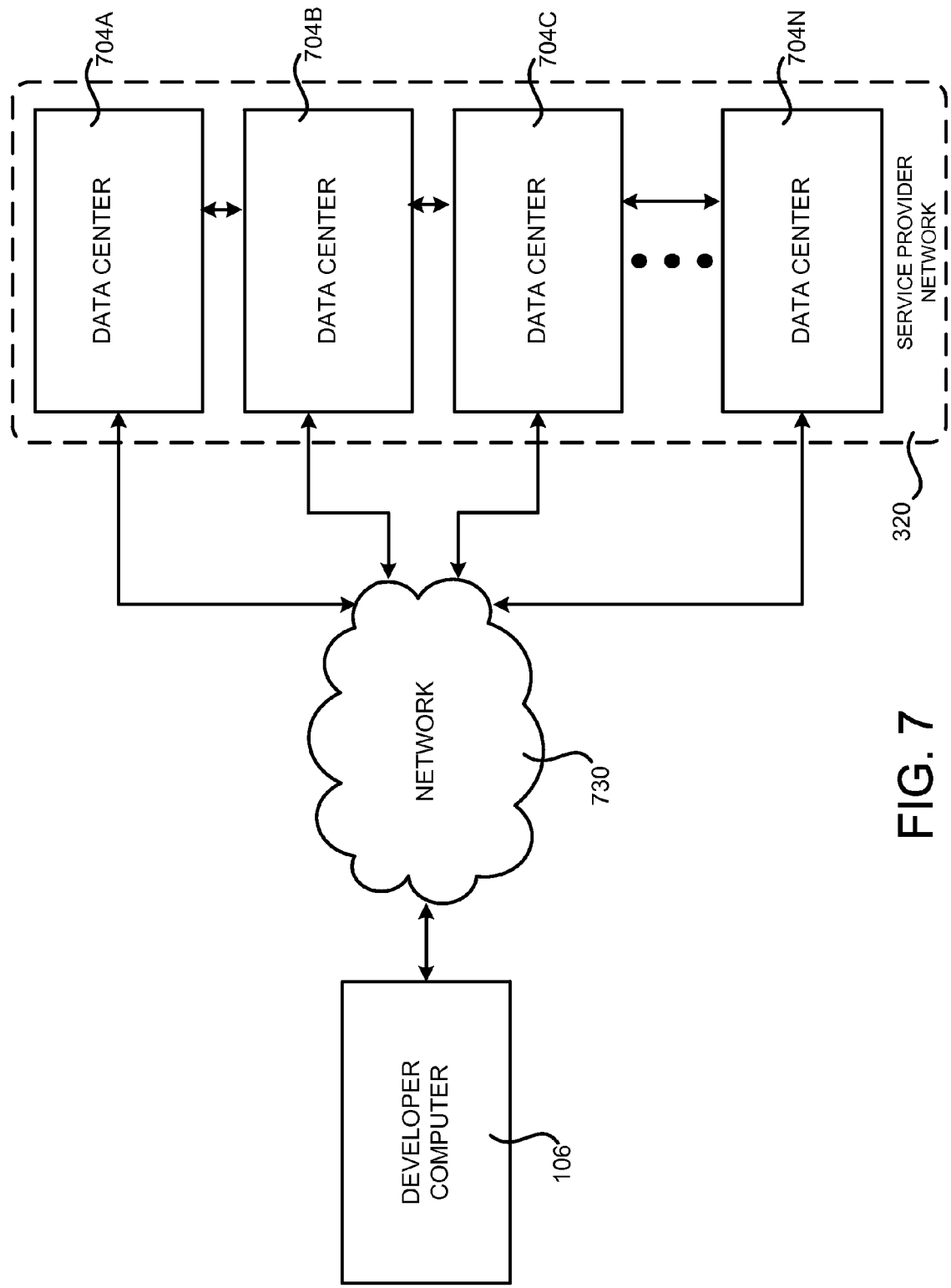
FIG. 7 is a system and network diagram that shows one illustrative operating environment for the technologies disclosed herein that includes a service provider network.

FIG. 7 and the following description are intended to provide a brief, general description of a suitable computing environment in which the technologies described herein may be implemented. In particular, FIG. 7 is a system and network diagram that shows an illustrative operating environment that includes a service provider network 320. In some configurations, the service provider network 320 can provide virtual machine instances and computing resources on a permanent or an as-needed basis.

The computing resources provided by the service provider network 320 may include various types of resources, such as data processing resources, data storage resources, networking resources, data communication resources and the like. Each type of computing resource may be general-purpose or may be available in a number of specific configurations. For example, and as will be described in greater detail below, data processing resources may be available as virtual machine instances in a number of different configurations. The virtual machine instances may be configured to execute applications, including Web servers, application servers, media servers, database servers and other types of applications. Data storage resources may include file storage devices, block storage devices and the like. Each type or configuration of a virtual machine instance of a computing resource may be available in different sizes, such as large resources, consisting of many processors, large amounts of memory, and/or large storage capacity, and small resources consisting of fewer processors, smaller amounts of memory and/or smaller storage capacity.

The computing resources provided by the service provider network 320 are enabled in one implementation by one or more data centers 704A-704N (which may be referred to herein singularly as "a data center 704" or collectively as "the data centers 704"). The data centers 704 are facilities utilized to house and operate computer systems and associated components. The data centers 704 typically include redundant and backup power, communications, cooling and security systems. The data centers 704 might also be located in geographically disparate locations. One illustrative configuration for a data center 704 that implements some or all of the concepts and technologies disclosed herein will be described below with regard to FIG. 8.

The users and customers of the service provider network 320 may access the computing resources provided by the data centers 704 over a suitable data communications network, such as a Wide Area Network ("WAN"), as illustrated by network 730. Although a WAN might be used, it should be appreciated that a local-area network ("LAN"), the Internet, or any other networking topology known in the art that connects the data centers 704 to the developer computer 106 may be utilized. It should also be appreciated that combinations of such networks might also be utilized.

Figure 8:
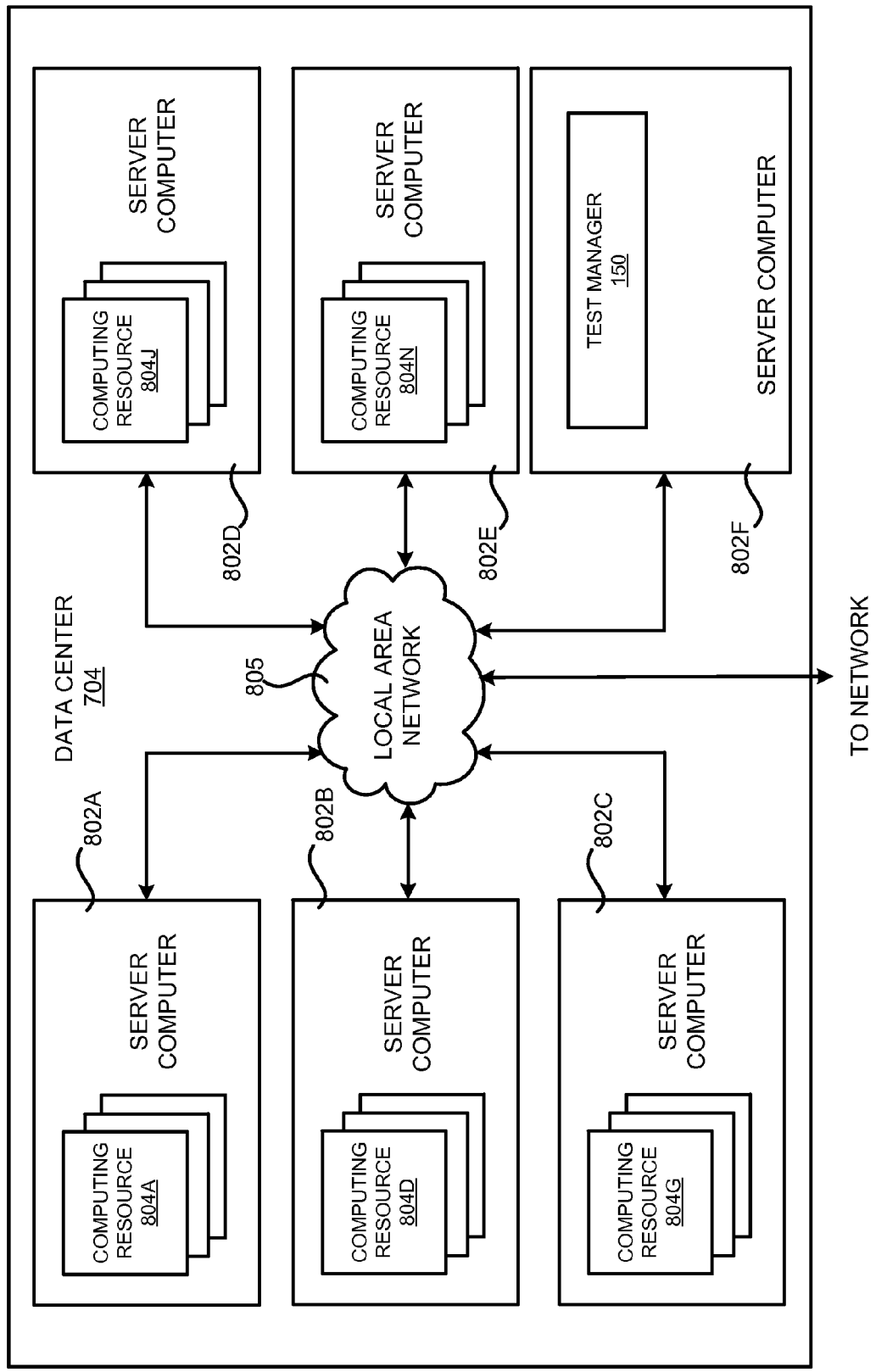
FIG. 8 is a computing system diagram that illustrates one configuration for a data center that implements aspects of a service provider network, including some or all of the concepts and technologies disclosed herein relating to testing a program.

FIG. 8 is a computing system diagram that illustrates one configuration for a data center 704 that implements aspects of a service provider network 320, including some or all of the concepts and technologies disclosed herein relating to testing a program 108. The example data center 704 shown in FIG. 8 includes several server computers 802A-802E (which may be referred to herein singularly as "a server computer 802" or in the plural as "the server computers 802") for providing computing resources. The server computers 802 may be standard tower or rack-mount server computers configured appropriately for providing the computing resources described herein. According to some configurations, the server computers 802 are configured to execute test manager 150, or other components, as described above.

In one configuration, some of the computing resources 804 are virtual machine instances. As known in the art, a virtual machine instance is an instance of a software implementation of a machine (i.e. a computer) that executes programs like a physical machine. Each of the server computers 802 may be configured to execute an instance manager (not shown) capable of instantiating and managing computing resources and instances of computing resources. In the case of virtual machine instances, for example, the instance manager might be a hypervisor or another type of program configured to enable the execution of multiple virtual machine instances on a single server computer 802, for example.

It should be appreciated that although the technologies disclosed herein are described primarily in the context of virtual machine instances, other types of computing resources can be utilized with the concepts and technologies disclosed herein. For instance, the technologies disclosed herein might be utilized with hardware resources, data storage resources, data communications resources, networking resources, database resources and with other types of computing resources.

The data center 704 shown in FIG. 8 also includes a server computer 802F reserved for executing software components for managing the operation of the data center 704, the server computers 802, virtual machine instances, and other resources within the service provider network 320. The server computer 802F might also execute the test manager 150 as well as other components described herein. Details regarding the operation of each of these components has been provided above. In this regard, it should be appreciated that while these components are illustrated as executing within the service provider network 320, computing systems that are external to the service provider network 320 might also be utilized to execute some or all of these components. Other configurations might also be utilized.

In the example data center 704 shown in FIG. 8, an appropriate LAN 805 is utilized to interconnect the server computers 802A-802E and the server computer 802F. The LAN 805 is also connected to the network 730 illustrated in FIG. 7. It should be appreciated that the configuration and network topology illustrated in FIGS. 7 and 8 has been greatly simplified and that many more computing systems, networks and networking devices may be utilized to interconnect the various computing systems disclosed herein. Appropriate load balancing devices or software modules might also be utilized for balancing a load between each of the data centers 704A-704N, between each of the server computers 802A-802F in each data center 704 and between virtual machine instances and other types of computing resources provided by the service provider network 320.

It should be appreciated that the data center 704 described in FIG. 7 is merely illustrative and that other implementations might also be utilized. Additionally, it should be appreciated that the functionality provided by these components might be implemented in software, hardware, or a combination of software and hardware. Other implementations should be apparent to those skilled in the art.

Figure 9:
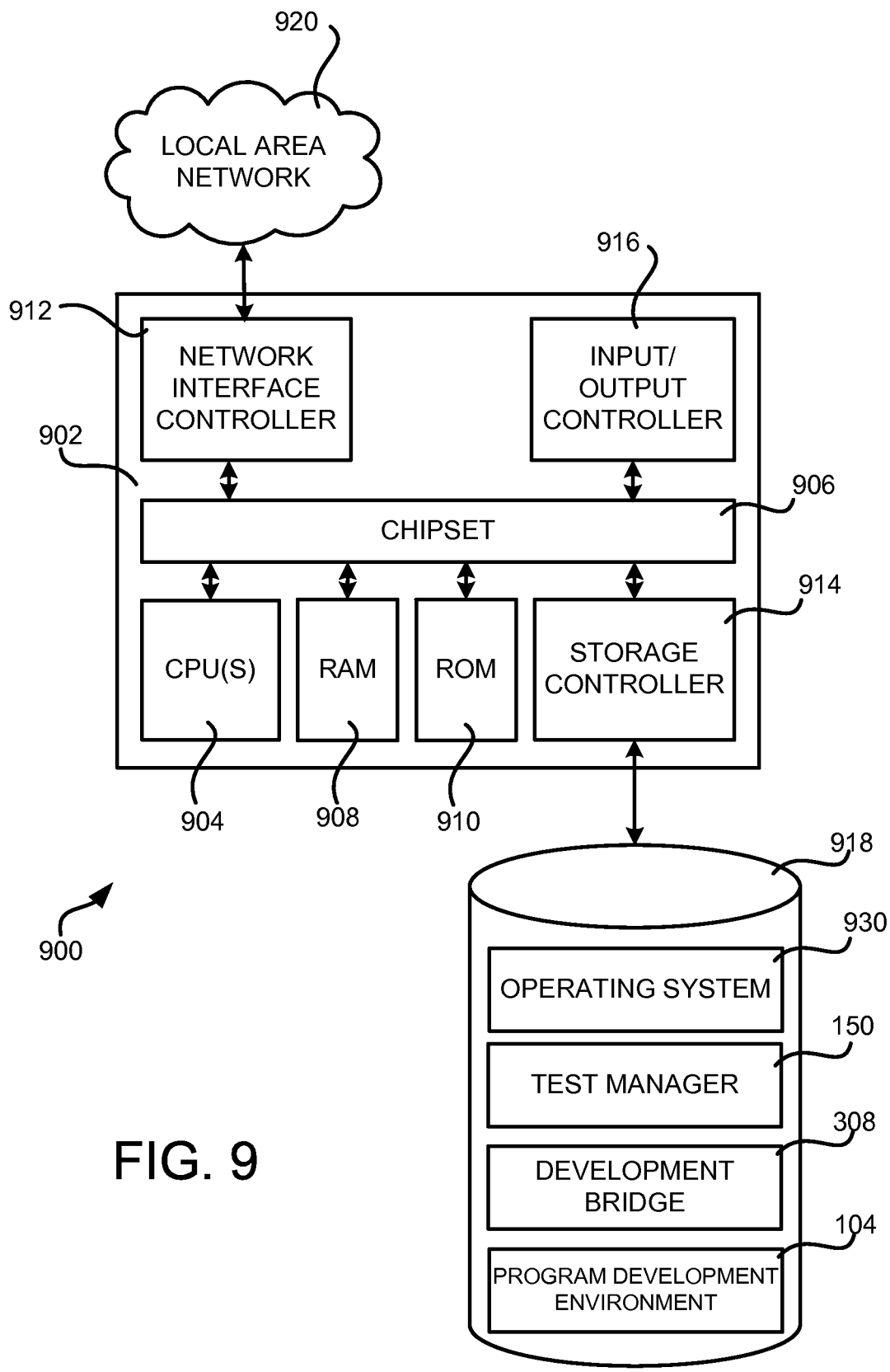
FIG. 9 is a computer architecture diagram showing an illustrative computer hardware architecture for implementing a computing device that might be utilized to implement aspects of the various technologies presented herein.

FIG. 9 shows an example computer architecture for a computer 900 capable of executing the program components described above for providing and utilizing a testing service The computer architecture shown in FIG. 9 illustrates a conventional server computer, workstation, desktop computer, laptop, tablet computing device, network appliance, personal digital assistant ("PDA"), e-reader, digital cellular phone, or other computing device, and may be utilized to execute any aspects of the software components presented herein. For example, the computer architecture shown in FIG. 9 may be utilized to execute the test manager 150, the development bridge 308, the program development environment 104, and/or the other components shown in FIGS. and described above.

The computer 900 includes a baseboard 902, or "motherboard," which is a printed circuit board to which a multitude of components or devices may be connected by way of a system bus or other electrical communication paths. In some configurations, one or more central processing units ("CPUs") 904 operate in conjunction with a chipset 906. The CPUs 904 may be standard programmable processors that perform arithmetic and logical operations necessary for the operation of the computer 900.

The CPUs 904 perform operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The chipset 906 provides an interface between the CPUs 904 and the remainder of the components and devices on the baseboard 902. The chipset 906 may provide an interface to a random access memory ("RAM") 908, used as the main memory in the computer 900. The chipset 906 may further provide an interface to a computer-readable storage medium such as a read-only memory ("ROM") 910 or non-volatile RAM ("NVRAM") for storing basic routines that help to startup the computer 900 and to transfer information between the various components and devices. The ROM 910 or NVRAM may also store other software components necessary for the operation of the computer 900 in accordance with the technologies described herein.

The computer 900 may operate in a networked environment using logical connections to remote computing devices and computer systems through a network, such as the local area network 920. The chipset 906 may include functionality for providing network connectivity through a NIC 912, such as a gigabit Ethernet adapter. The NIC 912 is capable of connecting the computer 900 to other computing devices over the network 920. It should be appreciated that multiple NICs 912 may be present in the computer 900, connecting the computer to other types of networks and remote computer systems.

The computer 900 may be connected to a mass storage device 918 that provides non-volatile storage for the computer. The mass storage device 918 may store system programs, application programs, other program modules, and data, which have been described in greater detail herein. The mass storage device 918 may be connected to the computer 900 through a storage controller 914 connected to the chipset 906. The mass storage device 918 may consist of one or more physical storage units. The storage controller 914 may interface with the physical storage units through a serial attached SCSI ("SAS") interface, a serial advanced technology attachment ("SATA") interface, a fiber channel ("FC") interface, or other type of interface for physically connecting and transferring data between computers and physical storage units.

The computer 900 may store data on the mass storage device 918 by transforming the physical state of the physical storage units to reflect the information being stored. The specific transformation of physical state may depend on various factors, in different implementations of this description. Examples of such factors may include, but are not limited to, the technology used to implement the physical storage units, whether the mass storage device 918 is characterized as primary or secondary storage, and the like.

For example, the computer 900 may store information to the mass storage device 918 by issuing instructions through the storage controller 914 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer 900 may further read information from the mass storage device 918 by detecting the physical states or characteristics of one or more particular locations within the physical storage units.

In addition to the mass storage device 918 described above, the computer 900 may have access to other computer-readable storage media to store and retrieve information, such as program modules, data structures, or other data. It should be appreciated by those skilled in the art that computer-readable storage media can be any available media that provides for the storage of non-transitory data and that may be accessed by the computer 900.

By way of example, and not limitation, computer-readable storage media may include volatile and non-volatile, removable and non-removable media implemented in any method or technology. Computer-readable storage media includes, but is not limited to, RAM, ROM, erasable programmable ROM ("EPROM"), electrically-erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage or other magnetic storage devices, or any other medium that can be used to store the desired information in a non-transitory fashion.

The mass storage device 918 may store an operating system 930 utilized to control the operation of the computer 900. According to some examples, the operating system comprises the LINUX operating system. According to another example, the operating system comprises the WINDOWS® SERVER operating system from MICROSOFT Corporation. According to further examples, the operating system may comprise the UNIX or ANDROID operating systems. It should be appreciated that other operating systems may also be utilized. The mass storage device 918 may store other system or application programs and data utilized by the computer 900, such as the test manager 150, the development bridge 308, the program development environment 104, and/or any of the other software components and data described above. The mass storage device 918 might also store other programs and data not specifically identified herein.

In some configurations, the mass storage device 918 or other computer-readable storage media is encoded with computer-executable instructions which, when loaded into the computer 900, transforms the computer from a general-purpose computing system into a special-purpose computer capable of implementing the technologies described herein. These computer-executable instructions transform the computer 900 by specifying how the CPUs 904 transition between states, as described above. According to some examples, the computer 900 has access to computer-readable storage media storing computer-executable instructions which, when executed by the computer 900, perform the various routines described above with regard to FIGS. 4-6. The computer 900 might also include computer-readable storage media for performing any of the other computer-implemented operations described herein.

The computer 900 may also include one or more input/output controllers 916 for receiving and processing input from a number of input devices, such as a keyboard, a mouse, a touchpad, a touch screen, an electronic stylus, or other type of input device. Similarly, the input/output controller 916 may provide output to a display, such as a computer monitor, a flat-panel display, a digital projector, a printer, a plotter, or other type of output device. It will be appreciated that the computer 900 may not include all of the components shown in FIG. 9, may include other components that are not explicitly shown in FIG. 9, or may utilize an architecture completely different than that shown in FIG. 9.

Based on the foregoing, it should be appreciated that technologies for implementing and utilizing a network-based program testing service have been presented herein. Moreover, although the subject matter presented herein has been described in language specific to computer structural features, methodological acts, and computer readable media, it is to be understood that the invention defined in the appended claims is not necessarily limited to the specific features, acts, or media described herein. Rather, the specific features, acts, and mediums are disclosed as example forms of implementing the claims.

The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the example configurations and applications illustrated and described, and without departing from the true spirit and scope of the present invention, which is set forth in the following claims.

What is claimed is:

1. A non-transitory computer-readable storage medium having computer-executable instructions stored thereupon which, when executed by a computer, cause the computer to:
   receive a request at a testing service to test operation of a program;
   programmatically perform a first event that simulates a first user interaction on a first screen display associated with the program, wherein the first screen display includes a first element;
   determine that a graphical change occurred to the first screen display based at least in part on programmatically performing the first event;
   programmatically identify a type of the first element based at least in part on the graphical change to the first screen display, wherein programmatically identifying includes one or more of a graphical analysis of a shape of the first element, or a response caused by the performance of the first event;
   determine one or more tests to perform based at least in part on the type of the first element;
   cause the first element on the first screen display to be tested using the one or more tests;
   programmatically perform a second event that simulates a second user interaction on the first screen display associated with the program;
   programmatically identify that the first screen display changed to a second screen display of the program caused by the second event, wherein the second screen display includes a second element;
   programmatically identify a type of the second element based at least in part on a shape of the second element;
   determine one or more second tests to perform based at least in part on the type of the second element;
   cause the second element to be tested using the one or more second tests;
   store test results associated with the testing; and
   provide the test results in response to the request.

2. The non-transitory computer-readable storage medium of claim 1, wherein the first element on the first screen display and the second element on the second screen display are tested by programmatically performing one or more additional events that simulate one or more further user interactions.

3. The non-transitory computer-readable storage medium of claim 2, wherein programmatically performing the one or more additional events comprises causing one or more events to be received by the program, the one or more events including a tap event, a tilt event, a pan event, a text entry event, a sleep event, a landscape mode event, a portrait mode event, or a device setting change event.

4. The non-transitory computer-readable storage medium of claim 1, wherein storing test results comprises capturing screen displays generated during the testing of the program and storing one or more performance metrics during the testing, the performance metrics comprising one or more of a memory usage, a CPU usage, a network traffic usage, a battery usage, or a graphics usage.

5. The non-transitory computer-readable storage medium of claim 1, wherein providing the test results comprises providing a test script that includes data associated with instructions used to test the program.

6. The non-transitory computer-readable storage medium of claim 1, wherein the testing service is implemented within a service provider network.

7. A system for testing a program, the system comprising:
   one or more processor-based computing devices configured to
      programmatically identify a shape of a first element included in a first display screen associated with an execution of the program;

programmatically identify a type of the first element based, at least in part, on a graphical analysis of the shape of the first element;

based at least in part on programmatically identifying a type of the first element, cause the first element to be programmatically tested;

programmatically identify a shape of a second element included in the first display screen;

programmatically identify a type of the second element based, at least in part, on a graphical analysis of the shape of the second element;

based at least in part on programmatically identifying a type of the second element, cause the second element to be programmatically tested;

store test results associated with a program; and provide the test results.

8. The system of claim 7, wherein causing the first element to be tested comprises causing an event to be sent to the program that simulates one or more user interactions with the first element.

9. The system of claim 7, further comprising programmatically identifying one or more other elements included in one or more other screen displays by programmatically identifying, without user interaction, the one or more other screen displays of the program presented in response to sending an event to the program that simulates one or more user interactions with the one or more other elements detected on the one or more other screen displays.

10. The system of claim 7, wherein at least one of one or more test devices or the one or more computing devices are further configured to change a device setting of at least one of the one or more test devices.

11. The system of claim 7, wherein recording the test results comprises capturing screen displays generated during the testing and recording one or more performance metrics during the testing, the metrics including one or more of a memory usage, a CPU usage, a network traffic usage, a battery usage, or a graphics usage of the program.

12. The system of claim 7, wherein providing the test results comprises providing at least one of a test script that includes data associated with instructions used to test the program or a screen graph that indicates the one or more screen displays identified.

13. The system of claim 7, wherein the one or more computing devices are further configured to send data to a developer computing device to display the test results in a graphical user interface (GUI).

14. The system of claim 13, wherein the GUI includes a user interface element for selecting the one or more test devices and a user interface element for defining one or more performance metrics to display in the GUI.

15. The system of claim 13, wherein the GUI provides a display of data that shows test events performed during the testing, a display of one or more performance metrics captured during the testing and a display of one or more screen captures generated during the testing.

16. A computer-implemented method for testing the operation of a program, the method implemented with a computer system having at least one processor coupled with computer-executable instructions, which when executed by the processor, perform the method steps, comprising:

programmatically identifying a first element included in a first screen display associated with an execution of the program based, at least in part, on a programmatic analysis of graphical data associated with a first screen display, wherein the programmatic analysis of the graphical data includes identifying a shape of the first element;

programmatically identifying a type of the first element based at least in part on the shape of the first element;

causing the first element to be tested based at least in part on the type of the first element;

programmatically identifying a second element included in the first screen display based, at least in part, on a programmatic analysis of graphical data associated with the first screen display, wherein the programmatic analysis of the graphical data includes identifying a shape of the second element;

programmatically identifying a type of the second element based at least in part on the shape of the second element;

causing the second element to be tested based at least in part on the type of the second element;

storing test results associated with the first element and the second element; and providing the test results.

17. The computer-implemented method of claim 16, wherein causing the first element to be tested comprises sending an event to the program that simulates one or more user interactions with the first element.

18. The computer-implemented method of claim 17, further comprising changing a device setting of a computing device during the testing.

19. The computer-implemented method of claim 16, further comprising providing a graphical user interface (GUI) to display the test results, wherein the GUI provides a graphical display of one or more performance metrics and a display of one or more of screen captures.

20. The computer-implemented method of claim 19, wherein the GUI comprises a user interface element for defining one or more performance metrics to display in the GUI and a user interface element for navigating to a next screen capture or a previous screen capture generated during the testing of the program.

* * * * *